(12) United States Patent
Hosokawa

(10) Patent No.: US 6,449,743 B1
(45) Date of Patent: Sep. 10, 2002

(54) METHOD OF GENERATING TEST SEQUENCES

(75) Inventor: Toshinori Hosokawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/350,523

(22) Filed: Jul. 12, 1999

(30) Foreign Application Priority Data

Jul. 15, 1998 (JP) .......................................... 10-199936

(51) Int. Cl.$^7$ ......................................... G01R 31/3183
(52) U.S. Cl. ...................................................... 714/738
(58) Field of Search ................................ 714/738, 728

(56) References Cited

U.S. PATENT DOCUMENTS 5,502,729 A * 3/1996 Nakata ....................... 714/728

OTHER PUBLICATIONS

Nierman et al. "Test Compaction for Sequential Circuits" Feb. 1992 IEEE Transactions on Computer–Aided Design pp. 260–267.*

T.M. Niermann et al., "Test Compaction for Sequential Circuits", IEEE Transactions on Computer–Aided Design, vol. 11, No. 2, pp. 260–267, Feb. 1992.

T. Inouoe et al., "An RT Level Partial Scan Design Method Based on Combinational ATPG", Technical Report of IEICE. FTS96–67, pp. 73–80, Feb. 1997.

* cited by examiner

Primary Examiner—Albert Decady
Assistant Examiner—Cynthia Harris
(74) Attorney, Agent, or Firm—Nixon Peabody LLP; Donald R. Studebaker

(57) ABSTRACT

Test sequences for use in fault testing for an integrated circuit are efficiently generated. The integrated circuit is subjected to timeframe expansion, thereby generating a time expansion model including a combinational circuit. With respect to this time expansion model, a compaction template is generated by compacting one or more primitive templates indicating whether or not a primary input or a pseudo primary input is present in each time. Test patterns are generated with respect to the time expansion model, and the generated test patterns are transformed, with compaction accompanied, into test sequences. The compaction is conducted by substituting the respective test patterns in the compaction template and connecting the resultant compaction templates. In this manner, short test sequences can be efficiently generated without spending much time on the compaction.

8 Claims, 41 Drawing Sheets

Fig. 6

| Time | PI1 | PI2 | PI3 |
|---|---|---|---|
| 0 | b | b | b |
| 1 | b | x | x |
| 2 | x | x | x |
| 3 | x | x | x |
| 4 | x | b | x |
| 5 | x | x | b |
| 6 | x | x | x |

Fig. 7

| $\cap_2$ | A | |
|---|---|---|
| | b | x |
| B | b | Φ | b |
| | x | b | x |

```
b b b                    b b b
b x x       b b b        Φ b b
x x x       b x x        b x x
x x x  ∩₂   x x x    =   x x x     Not compatible
x b x       x x x        x b x
x x b       x b x        x b b
x x x       x x b        x x b
            x x x        x x x
```

Fig. 8(a) Skew 1

```
b b b                    b b b
b x x                    b x x
x x x       b b b        b b b
x x x   ∩₂  b x x    =   b x x     compatible
x b x       x x x        x b x
x x x       x b x        x b x
            x x b        x x b
            x x x        x x x
```

Fig. 8(b) Skew 2

```
b b b                    b b b
b x x                    b x x
x x x                    x x x
x x x       b b b        b b b
x b x   ∩₂  b x x    =   b b x    compatible
x x b       x x x        x x b
x x x       x b x        x x x
            x x b        x b x
            x x x        x x b
                         x x x
```

Fig. 8(c) Skew 3

```
b b b                    b b b
b x x                    b x x
x x x                    x x x
x x x                    x x x
x b x   ∩₂  b b b    =   b Φ b    Not compatible
x x b       b x x        b x b
x x x       x x x        x x x
            x b x        x x x
            x x b        x b x
            x x x        x x b
                         x x x
```

Fig. 8(d) Skew 4

```
b b b                    b b b
b x x                    b x x
x x x                    x x x
x x x   ∩₂               x x x
x b x                    x b x
x x b       b b b    =   b b Φ   Not compatible
x x x       b x x        b x x
            x x x        x x x
            x x x        x x x
            x b x        x b x
            x x b        x x b
            x x x        x x x
```

Fig. 8(e) Skew 5

```
b b b                    b b b
b x x                    b x x
x x x                    x x x
x x x   ∩₂               x x x
x b x                    x b x
x x b                =   x x b    compatible
x x x       b b b        b b b
            b x x        b x x
            x x x        x x x
            x x x        x x x
            x b x        x b x
            x x b        x x b
            x x x        x x x
```

Fig. 8(f) Skew 6

Fig. 9

|   | 0 | 1 | 2 | 3 | 4 | 5 | 6 |
|---|---|---|---|---|---|---|---|
| 0 | 0 | 0 | 1 | 1 | 0 | 0 | 1 |
| 1 | 0 | 0 | 0 | 1 | 1 | 0 | 0 |
| 2 | 1 | 0 | 0 | 0 | 1 | 1 | 0 |
| 3 | 1 | 1 | 0 | 0 | 0 | 1 | 1 |
| 4 | 0 | 1 | 1 | 0 | 0 | 0 | 1 |
| 5 | 0 | 0 | 1 | 1 | 0 | 0 | 0 |
| 6 | 1 | 0 | 0 | 1 | 1 | 0 | 0 |

Fig. 10(a)

nbr(1) = {3, 4}
nbr(2) = {0, 5, 4}
nbr(0) = {2, 3, 6}
nbr(3) = {0, 1, 5, 6}
nbr(6) = {0, 3, 4}
nbr(4) = {2, 1, 6}
nbr(5) = {2, 3}

Fig. 10(b)

| | Label | 0 | 1 | 2 | 3 | 4 | 5 | 6 | |
|---|---|---|---|---|---|---|---|---|---|
| V={0} | 0: | 0 | 0 | 1 | 1 | 0 | 0 | 1 | |
| | | | | | 3 | 4 | | 3 | Number of edges |
| ↓ | | | | | 4 | 3 | | 2 | Total of weights |
| | | | | | | | | ↖ Select | |

| | Label | 0 | 1 | 2 | 3 | 4 | 5 | 6 | |
|---|---|---|---|---|---|---|---|---|---|
| V={0, 6} | 0: | 0 | 0 | 1 | 1 | 0 | 0 | 1 | AND |
| | 6: | 1 | 0 | 0 | 1 | 1 | 0 | 0 | |
| ↓ | | 0 | 0 | 0 | 1 | 0 | 0 | 0 | |

| | Label | 0 | 1 | 2 | 3 | 4 | 5 | 6 | |
|---|---|---|---|---|---|---|---|---|---|
| V={0, 3, 6} | 0: | 0 | 0 | 1 | 1 | 0 | 0 | 1 | |
| | 3: | 1 | 1 | 0 | 0 | 0 | 1 | 1 | AND |
| | 6: | 1 | 0 | 0 | 1 | 1 | 0 | 0 | |
| | | 0 | 0 | 0 | 0 | 0 | 0 | 0 | | compaction template

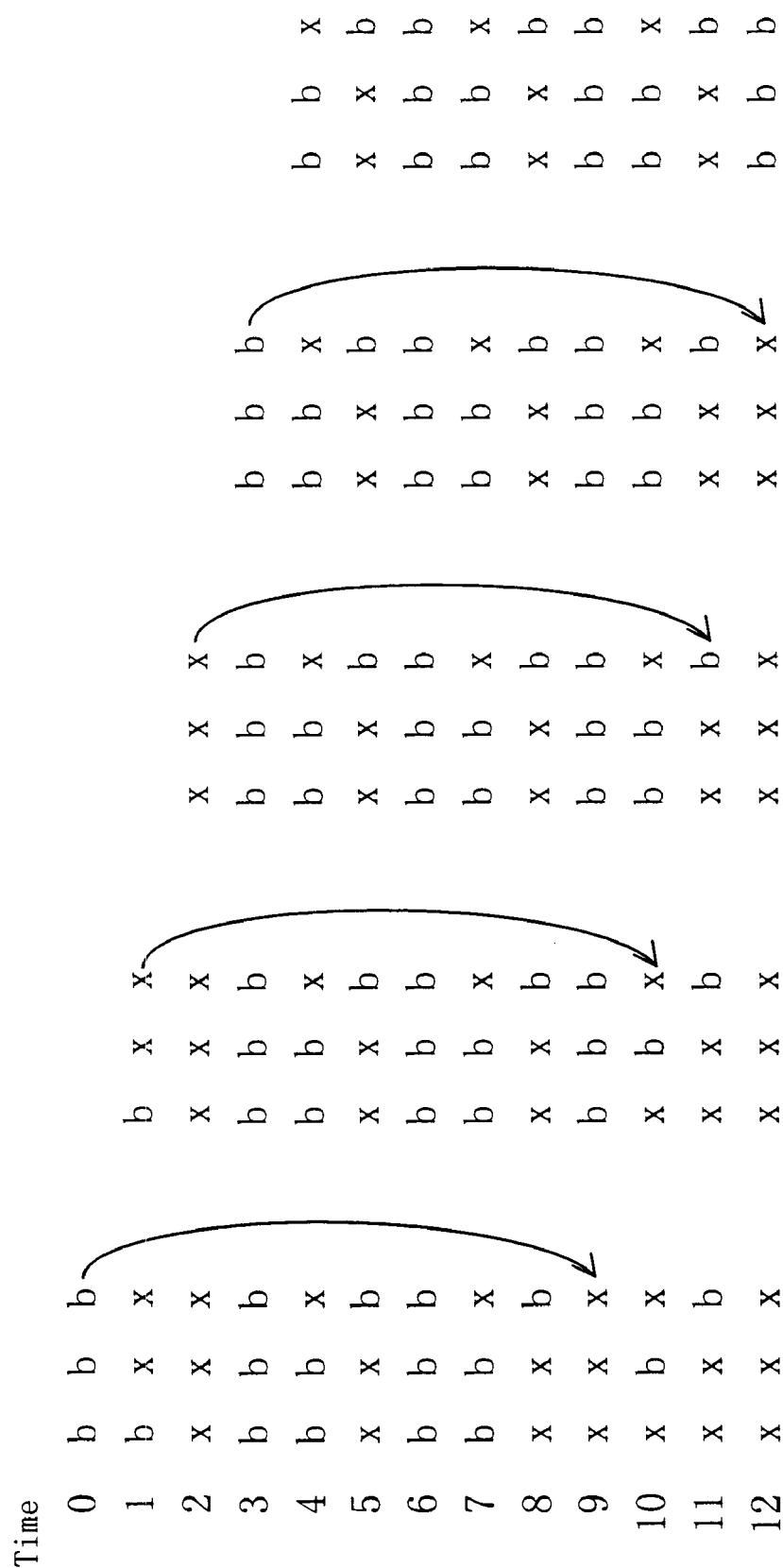

Fig. 13(a)

| | PI1(0) | PI2(0) | PI3(0) | PI1(1) | PI2(4) | PI3(5) |
|---|---|---|---|---|---|---|
| T1 | 0 | 1 | 0 | 0 | 0 | 1 |
| T2 | 1 | 1 | 0 | 0 | 1 | 0 |
| T3 | 1 | 0 | 1 | 0 | 0 | 0 |
| T4 | 0 | 0 | 0 | 0 | 0 | 0 |
| T5 | 1 | 1 | 1 | 1 | 0 | 0 |
| T6 | 0 | 1 | 0 | 1 | 0 | 1 |

| Time | PI1 | PI2 | PI3 |
|---|---|---|---|
| 0 | 0 | 1 | 0 |
| 1 | 0 | x | x |
| 2 | x | x | x |
| 3 | 1 | 1 | 0 |
| 4 | 0 | 0 | x |
| 5 | x | x | 1 |
| 6 | 1 | 0 | 1 |
| 7 | 0 | 1 | x |
| 8 | x | x | 0 |
| 9 | 0 | 0 | 0 |
| 10 | 0 | 0 | x |
| 11 | x | x | 0 |
| 12 | 1 | 1 | 1 |
| 13 | 1 | 0 | x |
| 14 | x | x | 0 |
| 15 | 0 | 1 | 0 |
| 16 | 1 | 0 | x |
| 17 | x | x | 0 |
| 18 | x | x | x |
| 19 | x | 0 | x |
| 20 | x | x | 1 |
| 21 | x | x | x |

Fig. 16

| ∩₃ | A | | |
|---|---|---|---|
| | 0 | 1 | x |
| B | 0 | 0 | Φ | 0 |
| | 1 | Φ | 1 | 1 |
| | x | 0 | 1 | x |

| Time | PI1 | PI2 | PI3 |
|---|---|---|---|
| 0 | 0 | 1 | 0 |
| 1 | 0 | x | x |
| 2 | 1 | 1 | 0 |
| 3 | 0 | 1 | 0 |
| 4 | 1 | 0 | 1 |
| 5 | 0 | x | 1 |
| 6 | x | 1 | x |
| 7 | 0 | 0 | 0 |
| 8 | 0 | 0 | 1 |
| 9 | x | x | 0 |
| 10 | 1 | 1 | 1 |
| 11 | 1 | 0 | x |
| 12 | x | x | 0 |
| 13 | x | x | x |
| 14 | x | 0 | x |
| 15 | x | x | 0 |
| 16 | x | x | x |

Fig. 21

| Time | PI1 | PI2 | PI3 | Simulation flag |
|------|-----|-----|-----|-----------------|
| 0    | 0   | 1   | 0   | ✓               |
| 1    | 0   | x   | x   |                 |
| 2    | x   | x   | x   |                 |
| 3    | 1   | 1   | 0   | ✓               |
| 4    | 0   | 0   | x   |                 |
| 5    | x   | x   | 1   |                 |
| 6    | 1   | 0   | 1   | ✓               |
| 7    | 0   | 1   | x   |                 |
| 8    | x   | x   | 0   |                 |
| 9    | x   | x   | x   |                 |
| 10   | x   | 0   | x   |                 |
| 11   | x   | x   | 0   |                 |
| 12   | x   | x   | x   |                 |

Boundary

Effective length −1

Overlap length

Fig. 22(a)

| Time | PI1 | PI2 | PI3 | Simulation flag |
|------|-----|-----|-----|-----------------|
| 0 | 0 | 1 | 0 | ✓ |
| 1 | ⓪ | ⓪ | ⓪ | |
| 2 | ① | 0 | 1 | |
| 3 | 1 | 1 | 0 | |
| 4 | 0 | 0 | 0 | |
| 5 | 1 | ⓪ | 1 | |
| 6 | 1 | 0 | ① | ✓ |
| 7 | 0 | 1 | 0 | |
| 8 | 1 | 1 | 0 | |
| 9 | x | x | x | |
| 10 | x | 0 | x | |
| 11 | x | x | 0 | |
| 12 | x | x | x | |

Reverse transformation

| PI1(0) | PI2(0) | PI3(0) | PI1(1) | PI2(4) | PI3(5) |
|--------|--------|--------|--------|--------|--------|
| 0 | 0 | 0 | 1 | 0 | 1 |

Boundary (between time 3 and 4)

Fig. 22(b)

| Time | PI1 | PI2 | PI3 | Simulation flag |
|------|-----|-----|-----|-----------------|
| 0 | 0 | 1 | 0 | ✓ |
| 1 | 0 | 0 | 0 | ✓ |
| 2 | ① | ⓪ | ① | |
| 3 | ① | 1 | 0 | ✓ |
| 4 | 0 | 0 | 0 | |
| 5 | 1 | 0 | 1 | |
| 6 | 1 | ⓪ | 1 | ✓ |
| 7 | 0 | 1 | ⓪ | |
| 8 | 1 | 1 | 0 | |
| 9 | x | x | x | |
| 10 | x | 0 | x | |
| 11 | x | x | 0 | |
| 12 | x | x | x | |

Reverse transformation

| PI1(0) | PI2(0) | PI3(0) | PI1(1) | PI2(4) | PI3(5) |
|--------|--------|--------|--------|--------|--------|
| 1 | 0 | 1 | 1 | 0 | 0 |

Boundary (between time 3 and 4)

Fig. 23(a)

| Time | PI1 | PI2 | PI3 | Simulation flag | Proportion of X |
|---|---|---|---|---|---|
| 0 | 0 | 1 | 0 | ✓ | |
| 1 | 0 | x | x | | 3/6 |
| 2 | 1 | 1 | 0 | ✓ | |
| 3 | 0 | x | x | | 4/6 Boundary |
| 4 | 1 | 0 | 1 | ✓ | |
| 5 | 0 | x | 1 | | |
| 6 | x | 1 | 0 | | |
| 7 | x | x | 0 | | |
| 8 | x | 0 | x | | |
| 9 | x | x | 0 | | |
| 10 | x | x | x | | |

Fig. 23(b)

| Time | PI1 | PI2 | PI3 | Simulation flag | Proportion of X |
|---|---|---|---|---|---|
| 0 | 0 | 1 | 0 | ✓ | |
| 1 | 0 | x | x | | 3/6 |
| 2 | 1 | 1 | 0 | ✓ | |
| 3 | 0 | 1 | 0 | ✓ | |
| 4 | 1 | 0 | 1 | ✓ | |
| 5 | 0 | x | 1 | | 3/6 |
| 6 | x | 1 | 0 | | 2/6<50% |
| 7 | 0 | 0 | 0 | ✓ | |
| 8 | 0 | 0 | 1 | | 3/6 |
| 9 | x | x | 0 | | 4/6 Boundary |
| 10 | 1 | 1 | 1 | ✓ | |
| 11 | 1 | 0 | x | | |
| 12 | x | x | 0 | | |
| 13 | x | x | x | | |
| 14 | x | 0 | x | | |
| 15 | x | x | 0 | | |
| 16 | x | x | x | | |

Reverse transformation

| PI1(0) | PI2(0) | PI3(0) | PI1(1) | PI2(4) | PI3(5) |
|---|---|---|---|---|---|
| 0 | 1 | 0 | 0 | 1 | 1 |

Fig. 27

| | PI1(0) | PI2(0) | PI3(0) | PI1(1) | PI2(4) | PI3(5) | Flag | Pointer | |
|---|---|---|---|---|---|---|---|---|---|
| t0 | X | X | X | X | 0 | 1 | | | BUF(0) |
| t1 | X | X | X | 0 | 1 | 1 | | | BUF(1) |
| t2 | X | X | X | 1 | 1 | 0 | | | BUF(2) |
| t3 | X | 1 | X | 0 | 0 | 0 | | | BUF(3) |
| t4 | X | X | 0 | 1 | 1 | 1 | | | BUF(4) |
| t5 | 0 | X | X | 1 | 0 | 0 | | | BUF(5) |
| t6 | 1 | 1 | X | 0 | 1 | 0 | | | BUF(6) |
| t7 | 1 | X | 1 | 1 | 1 | 1 | | | BUF(7) |

| | PI1(0) | PI2(0) | PI3(0) | PI1(1) | PI2(4) | PI3(5) | Flag | Pointer |
|---|---|---|---|---|---|---|---|---|
| t0 | X | X | X | X | 0 | 1 | | |
| t1 | X | X | X | 0 | 1 | 1 | | |
| t2 | X | X | X | 1 | 1 | 0 | | |
| t3 | X | 1 | X | 0 | 0 | 0 | | |
| t4 | X | X | 0 | 1 | 1 | 1 | | |
| t5 | 0 | X | X | 1 | 0 | 0 | | |
| t7 | 1 | X | 1 | 1 | 1 | 1 | | |
| t6·8 | 1 | 1 | 0 | 0 | 1 | 0 | | |

Fig. 29

| | PI1(0) | PI2(0) | PI3(0) | PI1(1) | PI2(4) | PI3(5) | Flag | Pointer |
|---|---|---|---|---|---|---|---|---|
| t0 | X | X | X | X | 0 | 1 | | |
| t1 | X | X | X | 0 | 1 | 1 | | |
| t2 | X | X | X | 1 | 1 | 0 | | |
| t3 | X | 1 | X | 0 | 0 | 0 | | |
| t4 | X | X | 0 | 1 | 1 | 1 | | |
| t5 | 0 | X | X | 1 | 0 | 0 | | |
| t9 | 1 | X | X | 1 | 0 | 0 | | |
| t7 | 1 | X | 1 | 1 | 1 | 1 | | |

Fig. 30

| Time | PI1 | PI2 | PI3 | Simulation flag |
|---|---|---|---|---|
| 0 | 1 | 1 | 0 | ✓ |
| 1 | 0 | X | X | |
| 2 | X | X | X | |
| 3 | X | X | X | |
| 4 | X | 0 | X | |
| 5 | X | X | 0 | |

Fig. 31

| | PI1(0) | PI2(0) | PI3(0) | PI1(1) | PI2(4) | PI3(5) | Flag | Pointer |
|---|---|---|---|---|---|---|---|---|
| t0 | X | X | X | X | 0 | 1 | | |
| t1 | X | X | X | 0 | 1 | 1 | | |
| t2 | X | X | X | 1 | 1 | 0 | | |
| t3 | X | 1 | X | 0 | 0 | 0 | | |
| t4 | X | X | 0 | 1 | 1 | 1 | | |
| t5 | 0 | X | X | 1 | 0 | 0 | | |
| t9 | 1 | X | X | 1 | 0 | 0 | | |
| t10 | X | 0 | X | 0 | 0 | 0 | | |

Fig. 32

| Time | PI1 | PI2 | PI3 | Simulation flag |
|---|---|---|---|---|
| 0 | 1 | 1 | 0 | ✓ |
| 1 | 0 | X | X | |
| 2 | 1 | 0 | 1 | ✓ |
| 3 | 1 | X | X | |
| 4 | X | 1 | X | |
| 5 | X | X | 0 | |
| 6 | X | 1 | X | |

Fig. 33

| Time | PI1 | PI2 | PI3 | Simulation flag |
|---|---|---|---|---|
| 0 | 1 | 1 | 0 | ✓ |
| 1 | [0] | [X] | [X] | |
| 2 | [1] | 0 | 1 | ✓ Reverse transformation → t11 {0XX1X0} |
| 3 | 1 | X | X | |
| 4 | X | 1 | X | |
| 5 | X | [X] | 0 | |
| 6 | X | 1 | [0] | |
| 7 | X | X | 1 | |

Fig. 34

| | PI1(0) | PI2(0) | PI3(0) | PI1(1) | PI2(4) | PI3(5) | Flag | Pointer |
|---|---|---|---|---|---|---|---|---|
| t0 | X | X | X | X | 0 | 1 | | |
| t1 | X | X | X | 0 | 1 | 1 | | |
| t2·11 | 0 | X | X | 1 | 1 | 0 | ✓ | Time 1 |
| t3 | X | 1 | X | 0 | 0 | 0 | | |
| t4 | X | X | 0 | 1 | 1 | 1 | | |
| t5 | 0 | X | X | 1 | 0 | 0 | | |
| t9 | 1 | X | X | 1 | 0 | 0 | | |
| t10 | X | 0 | X | 0 | 0 | 0 | | |

Fig. 35

| Time | PI1 | PI2 | PI3 | Simulation flag |
|---|---|---|---|---|
| 0 | 1 | 1 | 0 | ✓ |
| 1 | 0 | X | X | ✓ |
| 2 | 1 | 0 | 1 | ✓ |
| 3 | 1 | X | X | |
| 4 | X | 1 | X | |
| 5 | X | [1] | 0 | |
| 6 | X | 1 | 0 | |
| 7 | X | X | 1 | |

Fig. 36

| | PI1(0) | PI2(0) | PI3(0) | PI1(1) | PI2(4) | PI3(5) | Flag | Pointer |
|---|---|---|---|---|---|---|---|---|
| t0 | X | X | X | X | 0 | 1 | | |
| t1 | X | X | X | 0 | 1 | 1 | | |
| t3 | X | 1 | X | 0 | 0 | 0 | | |
| t4 | X | X | 0 | 1 | 1 | 1 | | |
| t5 | 0 | X | X | 1 | 0 | 0 | | |
| t9 | 1 | X | X | 1 | 0 | 0 | | |
| t10 | X | 0 | X | 0 | 0 | 0 | | |
| t2·11·12 | 0 | 1 | 0 | 1 | 1 | 0 | ✓ | Time 1 |

Fig. 40

| Time | PI1 | PI2 | PI3 |    |
|------|-----|-----|-----|----|
| 0    | 0   | 1   | X   | ↕2 |
| 1    | X   | 0   | X   |    |

Fig. 41

| Time | PI1 | PI2 | PI3 |
|------|-----|-----|-----|
| 0    | 0   | 0   | X   |
| 1    | X   | 1   | X   |
| 2    | 0   | 0   | 1   |
| 3    | 1   | 0   | X   |
| 4    | X   | 0   | X   |
| 5    | 1   | 1   | 0   |
| 6    | 1   | 0   | X   |
| 7    | X   | 0   | X   |
| 8    | 0   | 0   | 0   |

⇐ compaction

Update →

| Time | PI1 | PI2 | PI3 |
|------|-----|-----|-----|
| 0    | 0   | 0   | X   |
| 1    | 0   | 1   | X   |
| 2    | 0   | 0   | 1   |
| 3    | 1   | 0   | X   |
| 4    | X   | 0   | X   |
| 5    | 1   | 1   | 0   |
| 6    | 1   | 0   | X   |
| 7    | X   | 0   | X   |
| 8    | 0   | 0   | 0   |

Fig. 46

| Time | PI1 | PI2 | PI3 | PI4 | PI5 | PI6 | PI7 | PI8 |
|------|-----|-----|-----|-----|-----|-----|-----|-----|
| 0 | X | X | X | X | X | X | X | X |
| 1 | X | X | X | X | X | X | X | X |
| 2 | X | X | X | X | X | 1 | 1 | X |
| 3 | X | X | X | X | X | X | X | X |

Fig. 47

| Time | PI1 | PI2 | PI3 | PI4 | PI5 | PI6 | PI7 | PI8 |
|------|-----|-----|-----|-----|-----|-----|-----|-----|
| 0 | X | 0 | 1 | 0 | X | X | X | X |
| 1 | X | X | X | 1 | X | X | X | X |
| 2 | X | 0 | 0 | 0 | 1 | 0 | 0 | X |
| 3 | 0 | 1 | 0 | 1 | X | X | X | 0 |
| 4 | X | X | X | X | 0 | 1 | 0 | X |
| 5 | 0 | 0 | 0 | X | X | X | X | 1 | compaction ⇒
Update ↑

| Time | PI1 | PI2 | PI3 | PI4 | PI5 | PI6 | PI7 | PI8 |
|------|-----|-----|-----|-----|-----|-----|-----|-----|
| 0 | X | 0 | 1 | 0 | X | X | X | X |
| 1 | X | X | X | 1 | X | X | X | X |
| 2 | X | 0 | 0 | 1 | X | 0 | 0 | X |
| 3 | 0 | 1 | 0 | X | 1 | 1 | 1 | 0 |
| 4 | X | X | X | X | 0 | 1 | 0 | X |
| 5 | 0 | 0 | 0 | X | X | X | X | 1 |

METHOD OF GENERATING TEST SEQUENCES

BACKGROUND OF THE INVENTION

The present invention relates to test sequence generation technique used in fault testing for an integrated circuit (LSI).

As one of conventional methods of generating test sequences, a method using a time expansion model has been proposed ("An RT Level Partial Scan Design Method Based on Combinational ATPG", Inoue et al., TECHNICAL REPORT of IEICE, FTS96-67, February 1997, issued by Fault Tolerance Research Group of The Institute of Electronics, Information and Communication Engineers).

FIG. 48 is a flowchart for showing the outline of procedures in the method of generating test sequences using a time expansion model. As is shown in FIG. 48, an acyclic sequential circuit or an integrated circuit designed as a sequential circuit having an acyclic structure in testing is subjected to timeframe expansion, so as to generate a time expansion model (S210). Test patterns for detecting faults set with respect to the time expansion model are generated, so as to execute fault simulation (S220). Then, the test patterns generated with respect to the time expansion model are transformed into test sequences applicable to the original sequential circuit (S230).

In the conventional method of generating test sequences, the test patterns generated with respect to the time expansion model, that is, a combinational circuit, cannot be directly applied to the original sequential circuit as described above. Therefore, it is necessary to transform the test patterns into test sequences applicable to the original sequential circuit.

The transformation of test patterns into test sequences itself is comparatively easy. However, when test patterns are transformed into test sequences without giving any particular consideration, although the transformation process can be easily conducted, the ultimately obtained test sequences can be unnecessarily long as a whole. This can cause a serious problem in actual application of the method of generating test sequences using a time expansion model to design and fabrication of integrated circuits. However, no effective approach has been made to this problem.

SUMMARY OF THE INVENTION

An object of the invention is efficiently shortening test sequences obtained through test sequence generation using a time expansion model.

Specifically, the method of generating test sequences of this invention for use in fault testing for an integrated circuit comprises the steps of generating a time expansion model including a combinational circuit by subjecting the integrated circuit to timeframe expansion; and transforming test patterns generated with respect to the time expansion model into test sequences with respect to the integrated circuit, with compaction accompanied.

Preferably, the method of generating test sequences further comprises a step of generating a compaction template by compacting one or more primitive templates indicating whether or not a primary input or a pseudo primary input is present in each label of the time expansion model, and in the step of transforming test patterns, the test sequences are generated by substituting each of the test patterns in the compaction template and connecting resultant compaction templates.

In the method of generating test sequences, in the step of transforming test patterns, the compaction is preferably conducted in accordance with a compaction operation using three values of "don't care", "0" and "1".

In the method of generating test sequences, the step of transforming test patterns preferably includes substeps of subjecting an already generated test sequence to reverse transformation in process of test sequence transformation; executing fault simulation for the time expansion model by using a new test pattern obtained through the reverse transformation; and removing a fault detected in the fault simulation from a target of subsequent test sequence generation.

In the method of generating test sequences, the step of transforming test patterns preferably includes substeps of storing a generated test pattern in a test pattern compaction buffer, with compaction accompanied; when a test pattern is overflown from the test pattern compaction buffer, executing fault simulation for the time expansion model by using the overflown test pattern, so as to remove a fault detected in the fault simulation from a target of subsequent test sequence generation; transforming the overflown test pattern into a test sequence and compacting the resultant test sequence with an already generated test sequence; and subjecting the compacted test sequence to reverse transformation, so as to store a new test pattern obtained through the reverse transformation in the test pattern compaction buffer, with compaction accompanied.

Also, in the method of generating test sequences, the step of transforming test patterns preferably includes, in transforming one test pattern into a test sequence, substeps of executing fault simulation for the time expansion model by using the test pattern; obtaining a maximum value of labels including a primary output where a fault is detected in the fault simulation; and transforming the test pattern into a test sequence without using a value of a primary input belonging to a label with a value larger than the maximum value.

Alternatively, in the method of generating test sequences, the step of transforming test patterns preferably includes, in transforming one test pattern into a test sequence, substeps of executing fault simulation for the time expansion model by using the test pattern; specifying a primary input reachable from a primary output where a fault is detected in the fault simulation; and transforming the test pattern into a test sequence with a value of a primary input excluding the specified primary input set to "don't care".

BRIEF DESCRIPTION OF THE DRAWINGS

FIG. 6 is a primitive template generated based on the time expansion model of FIG. 5(b);

FIG. 7 is a diagram for showing a compaction operation defined in Embodiment 1 of the invention;

FIGS. 8(a) through 8(f) are diagrams for showing compaction trials conducted on the primitive template of FIG. 6 with respective skew values;

Figure 11:
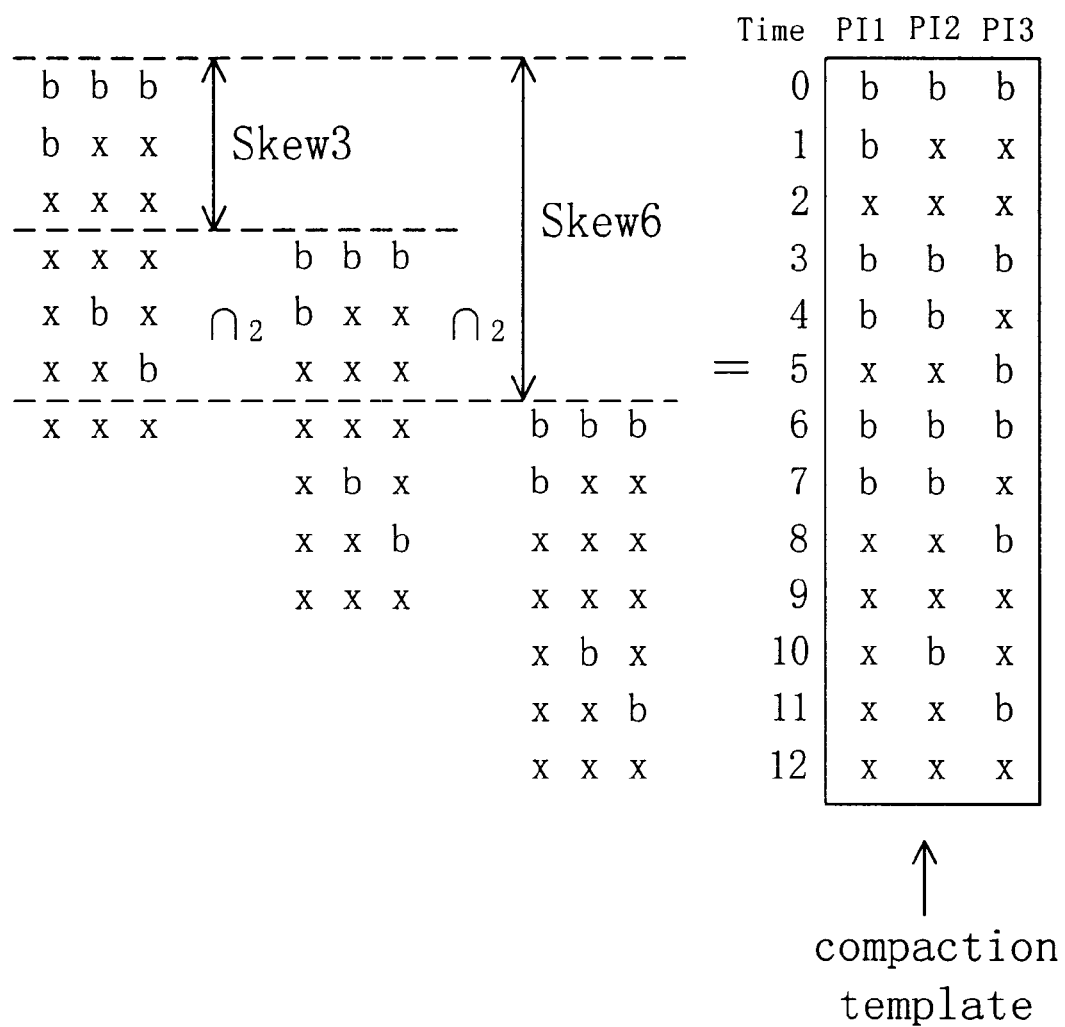
Figure 15:
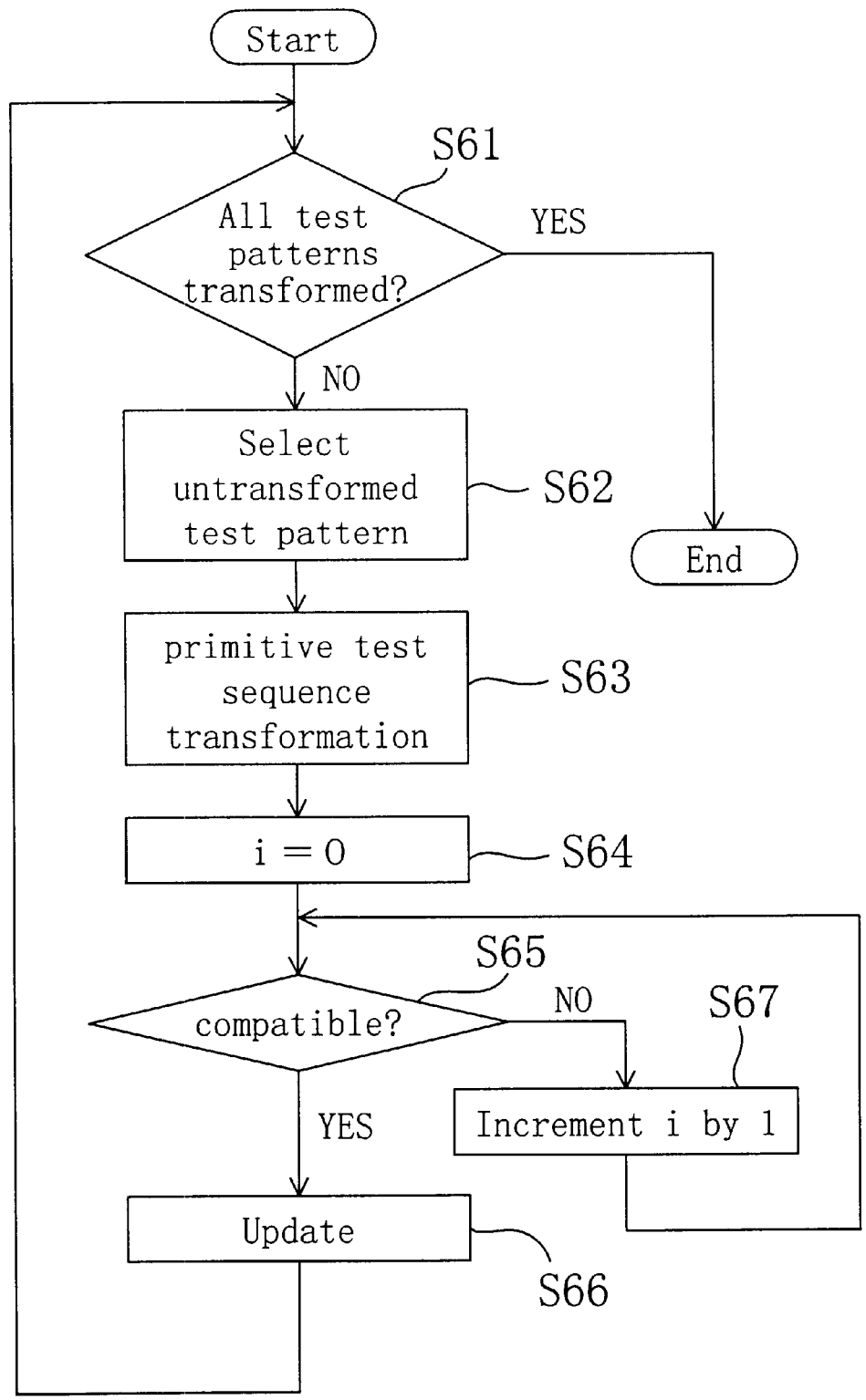
Figure 19:
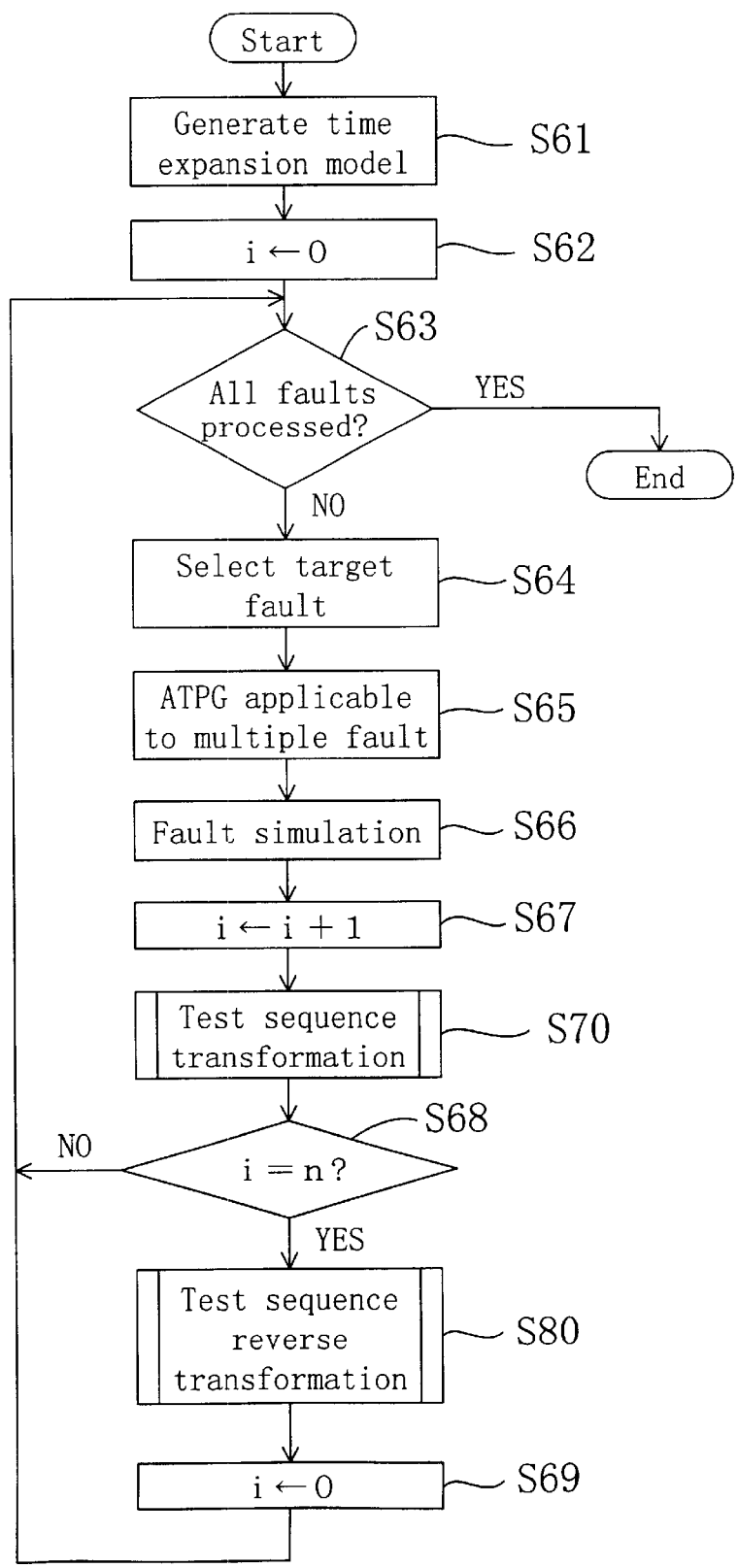
Figure 20A:
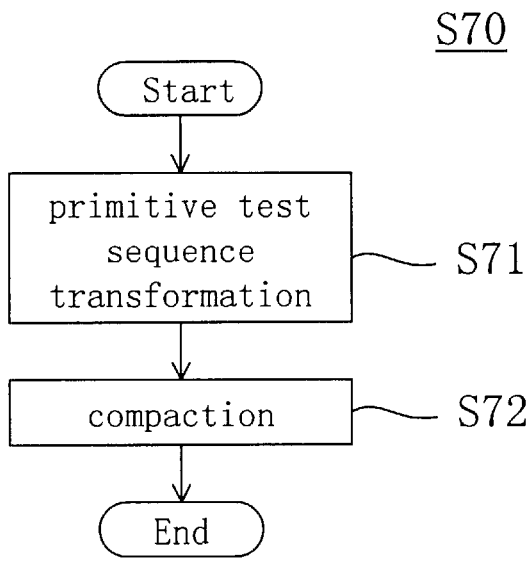
Figure 20B:
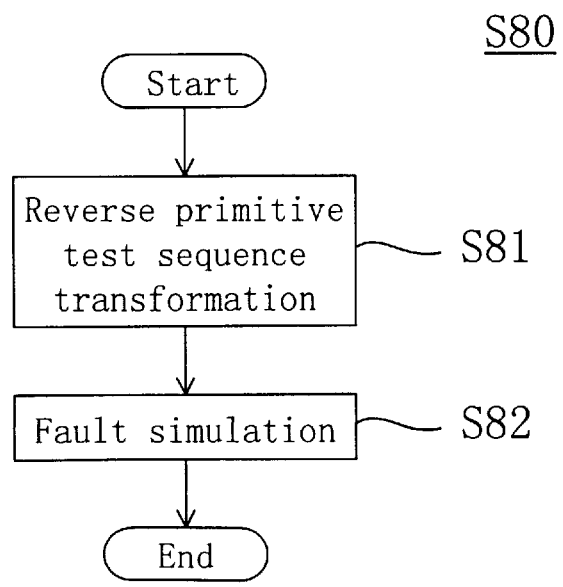
Figure 24:
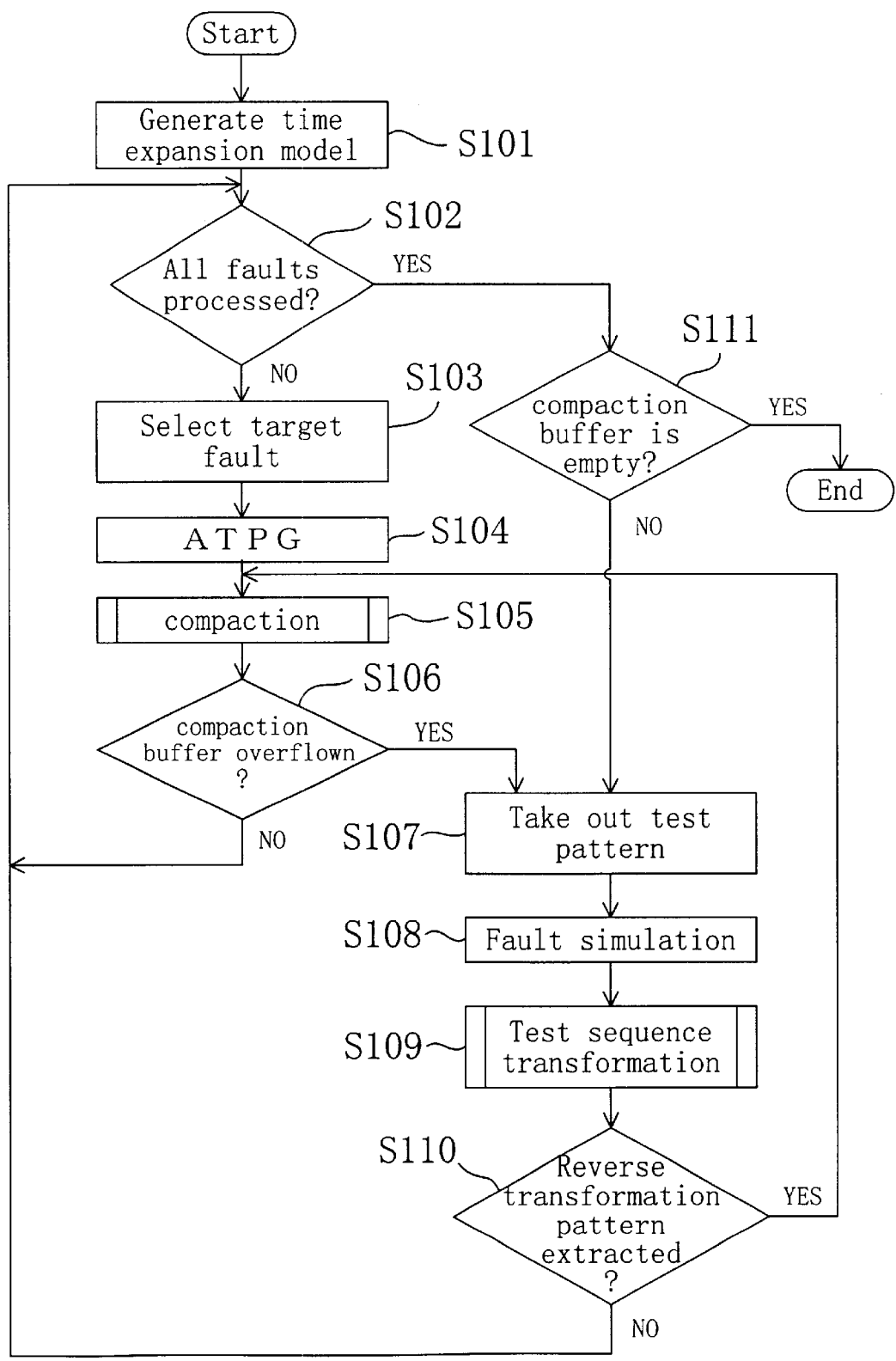
Figure 25:
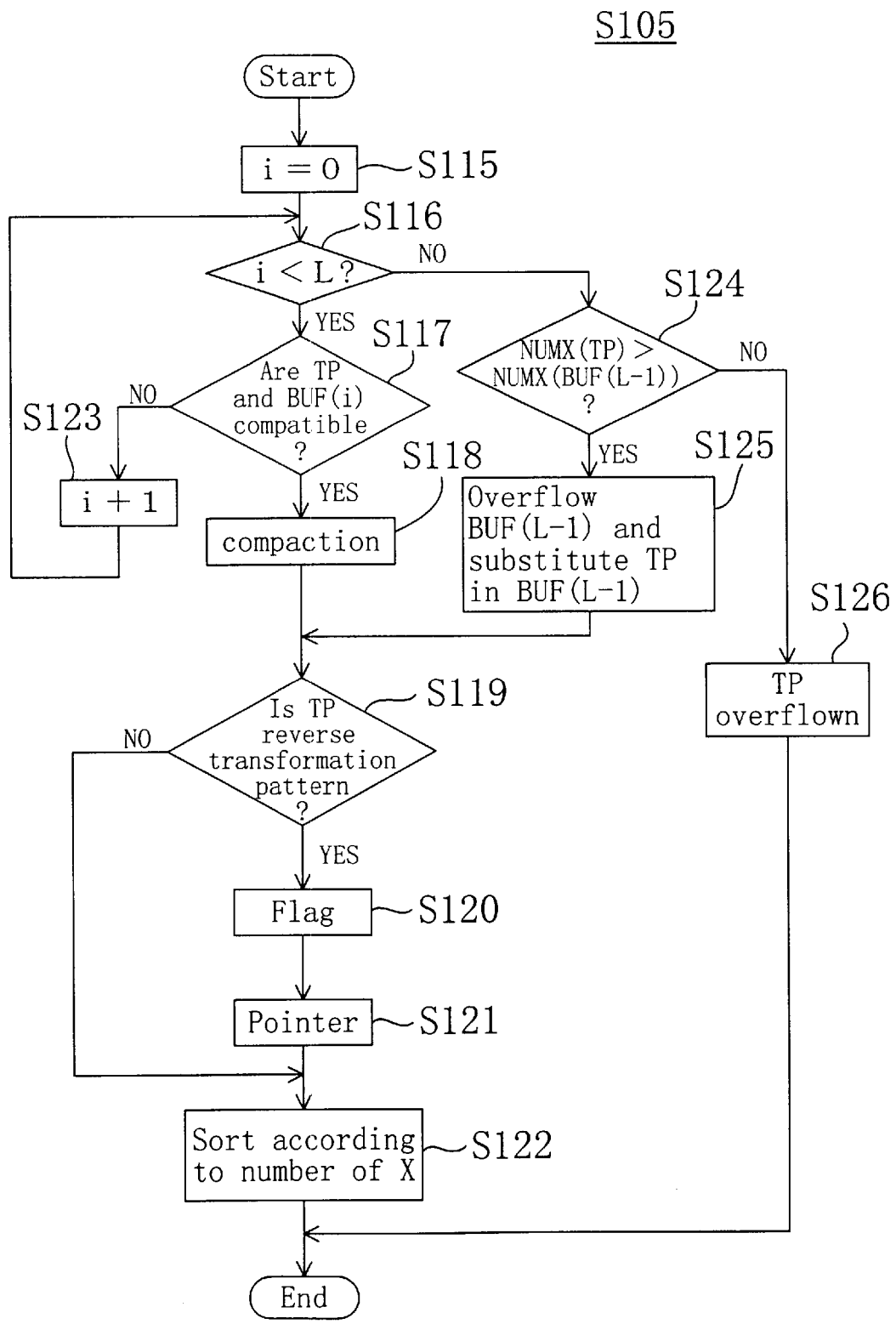
Figure 26:
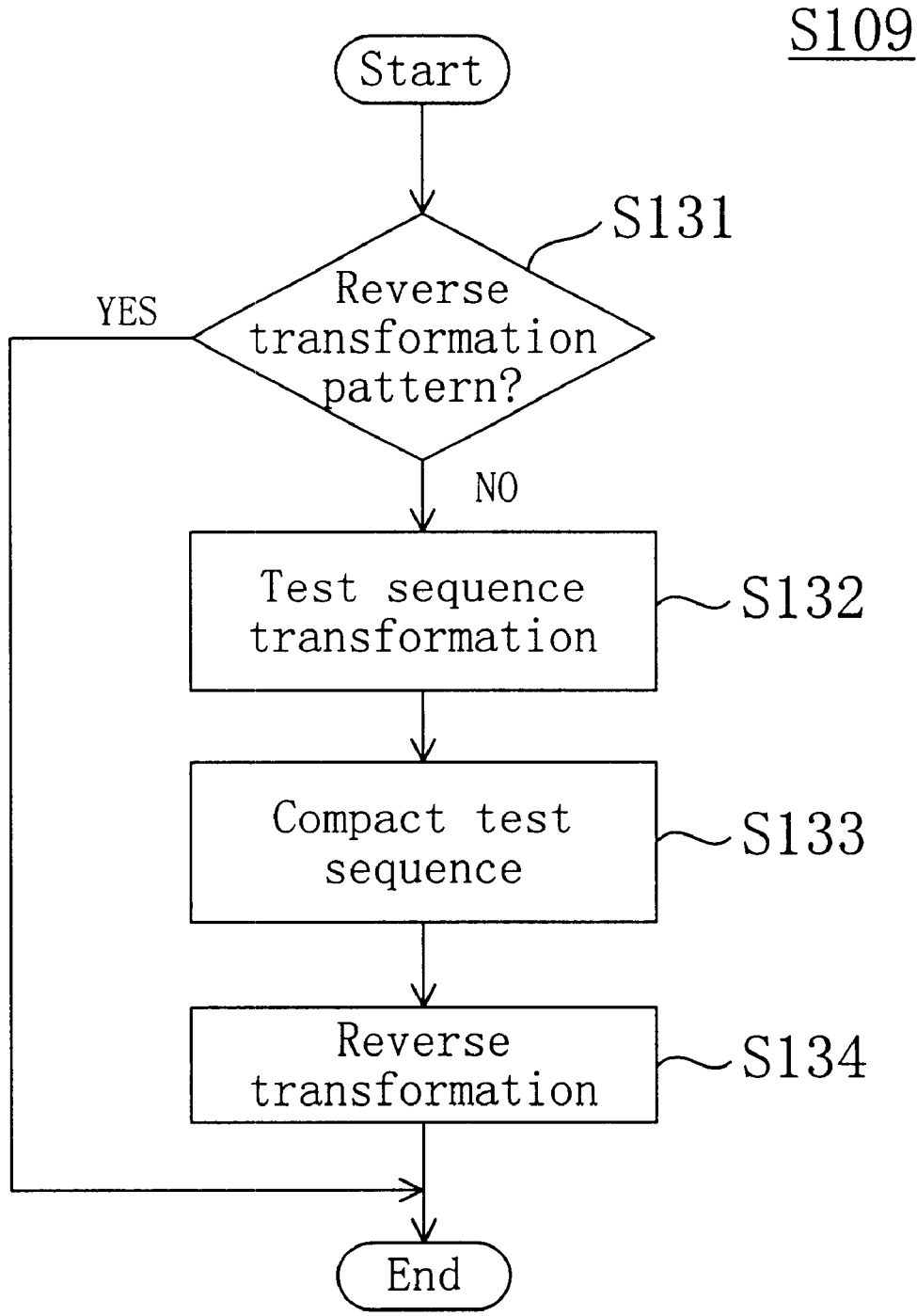
Figure 37:
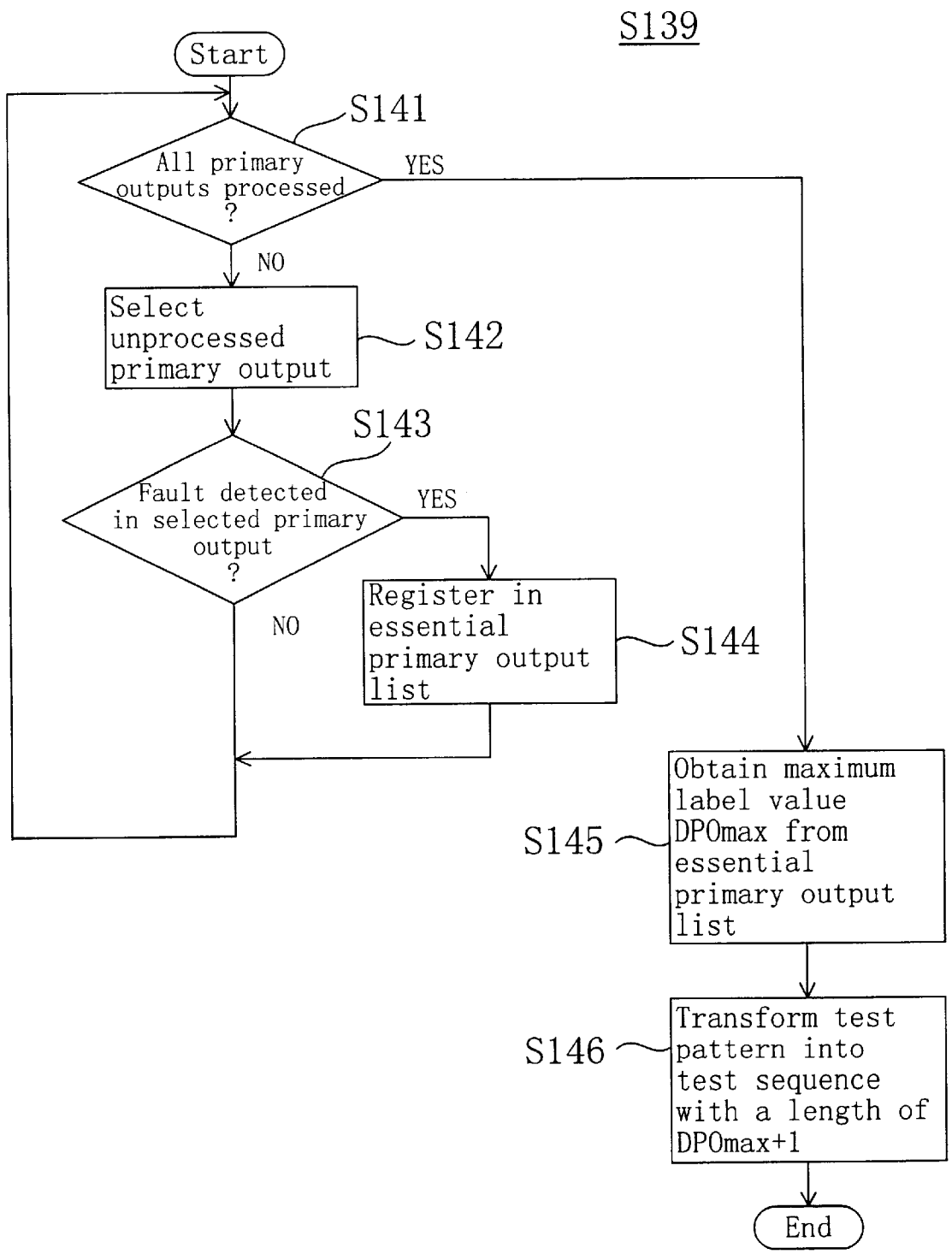
Figure 38:
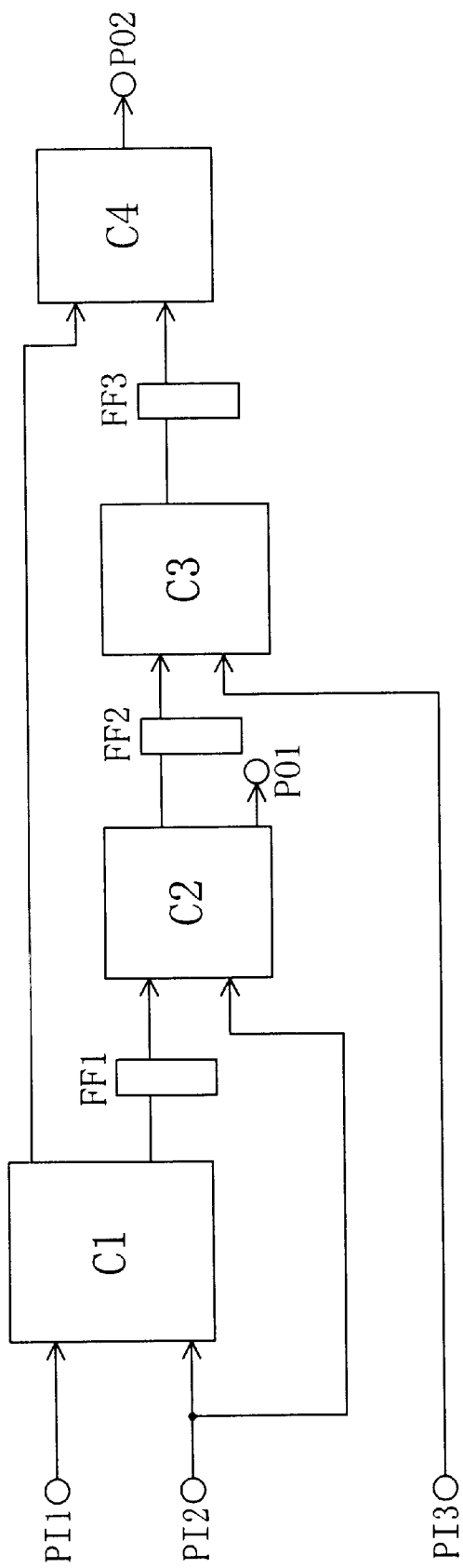
Figure 39:
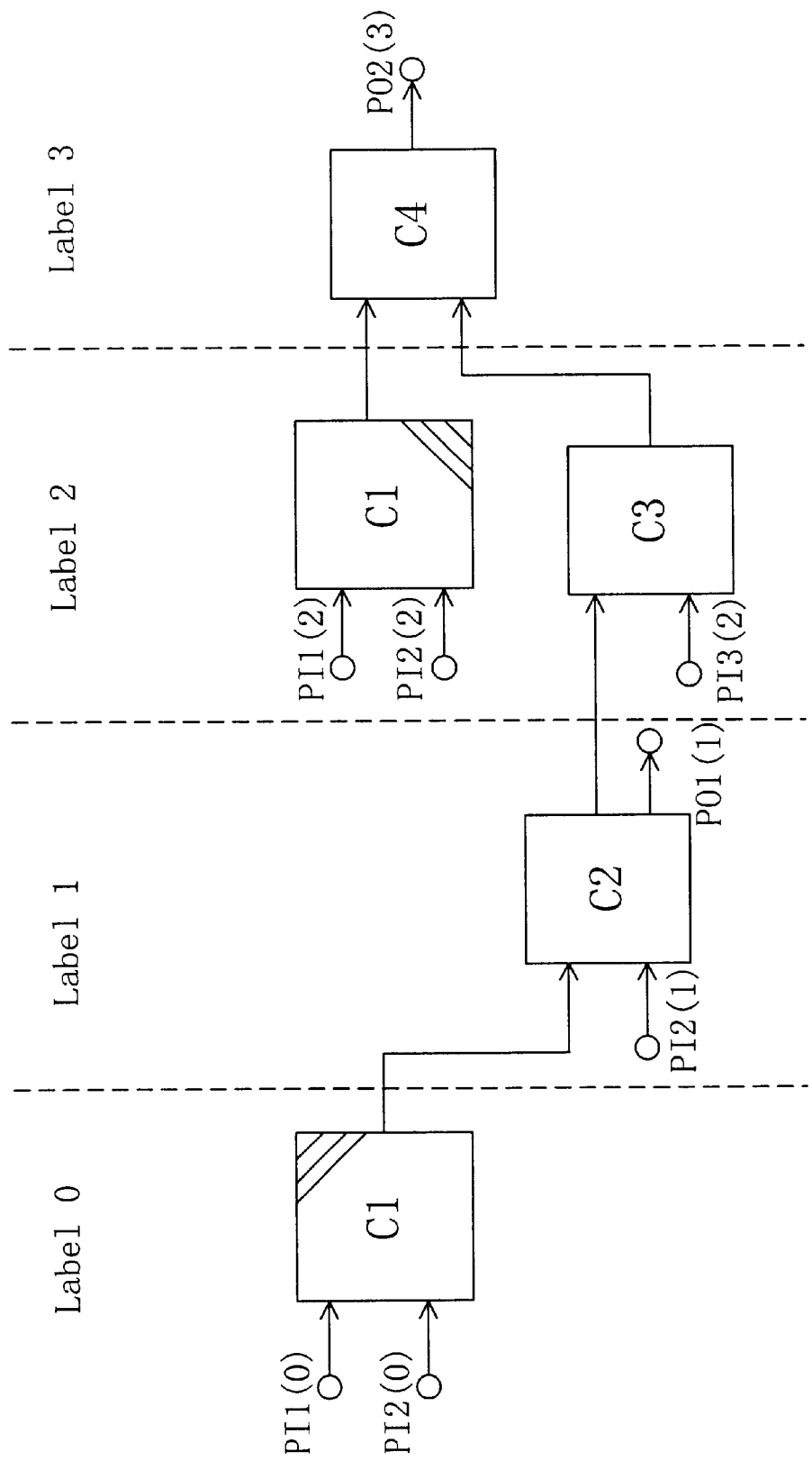
Figure 42:
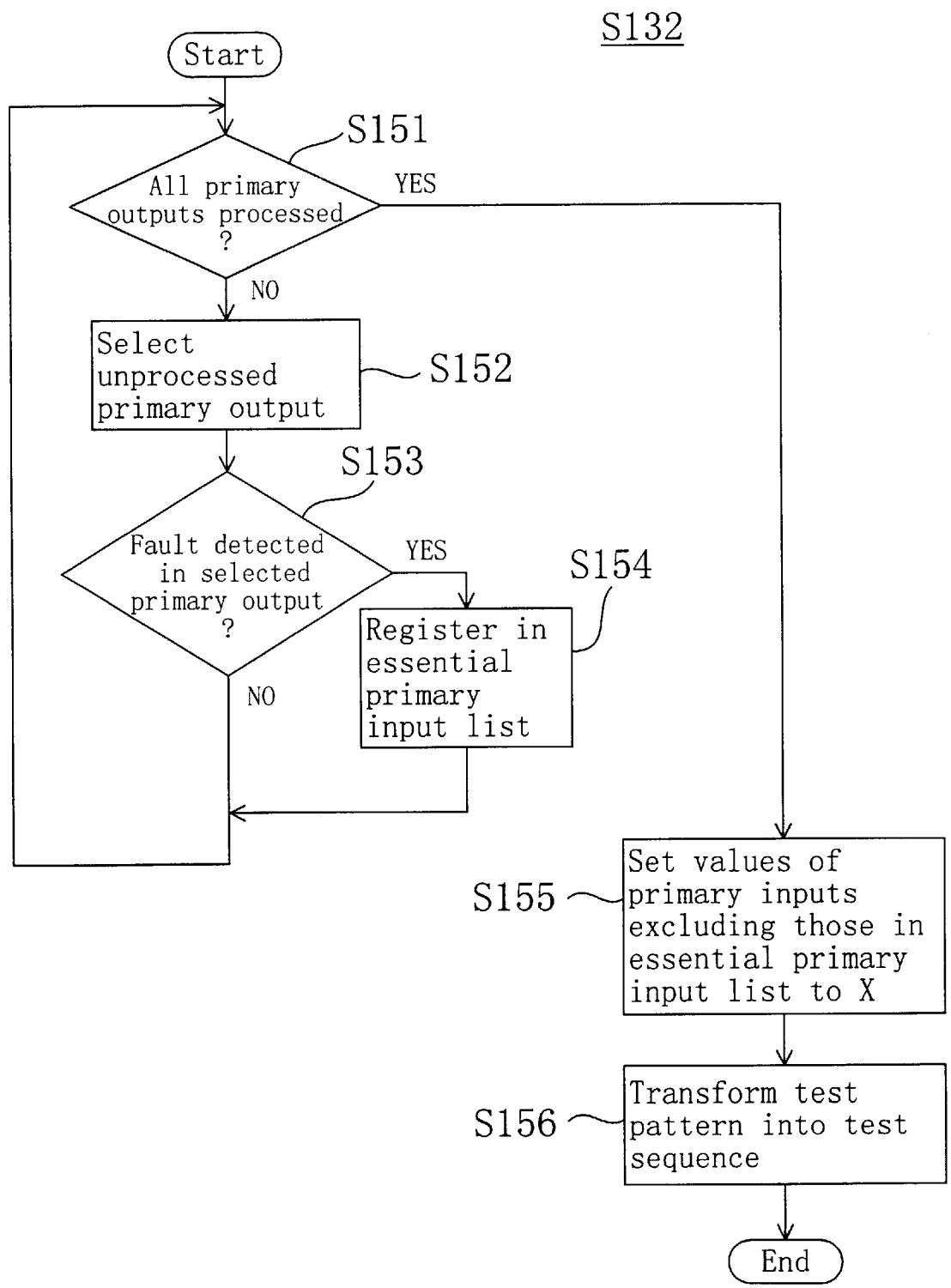
Figure 43:
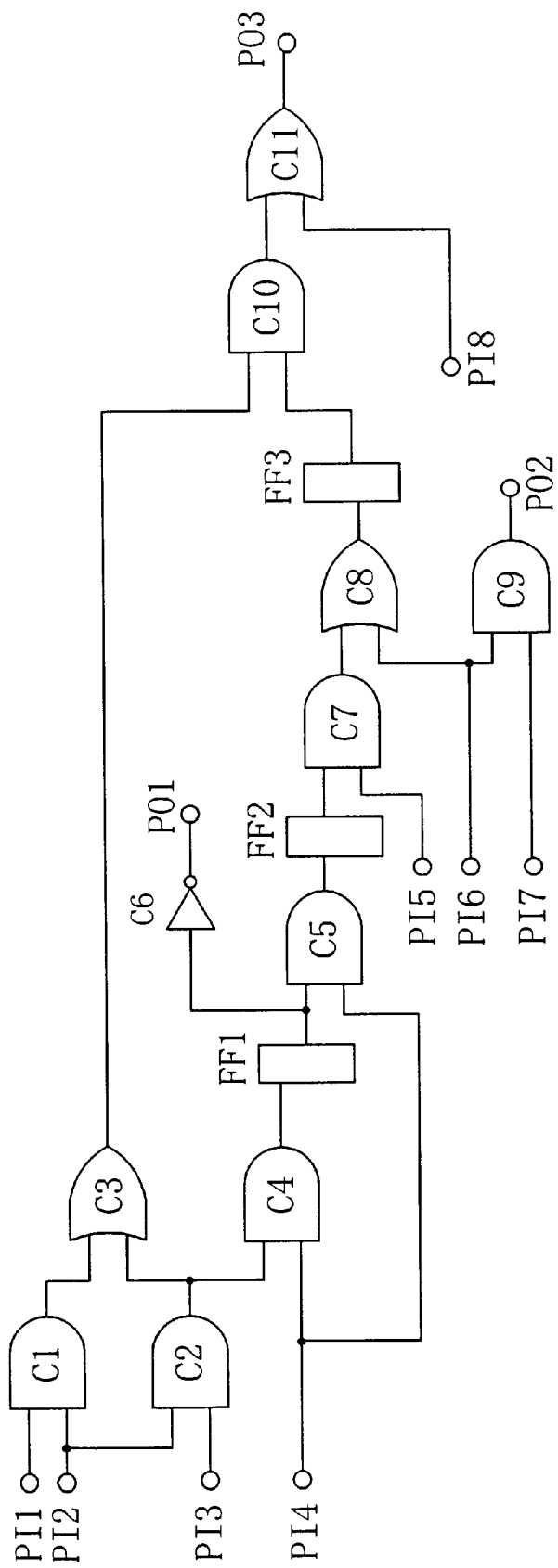
Figure 44:
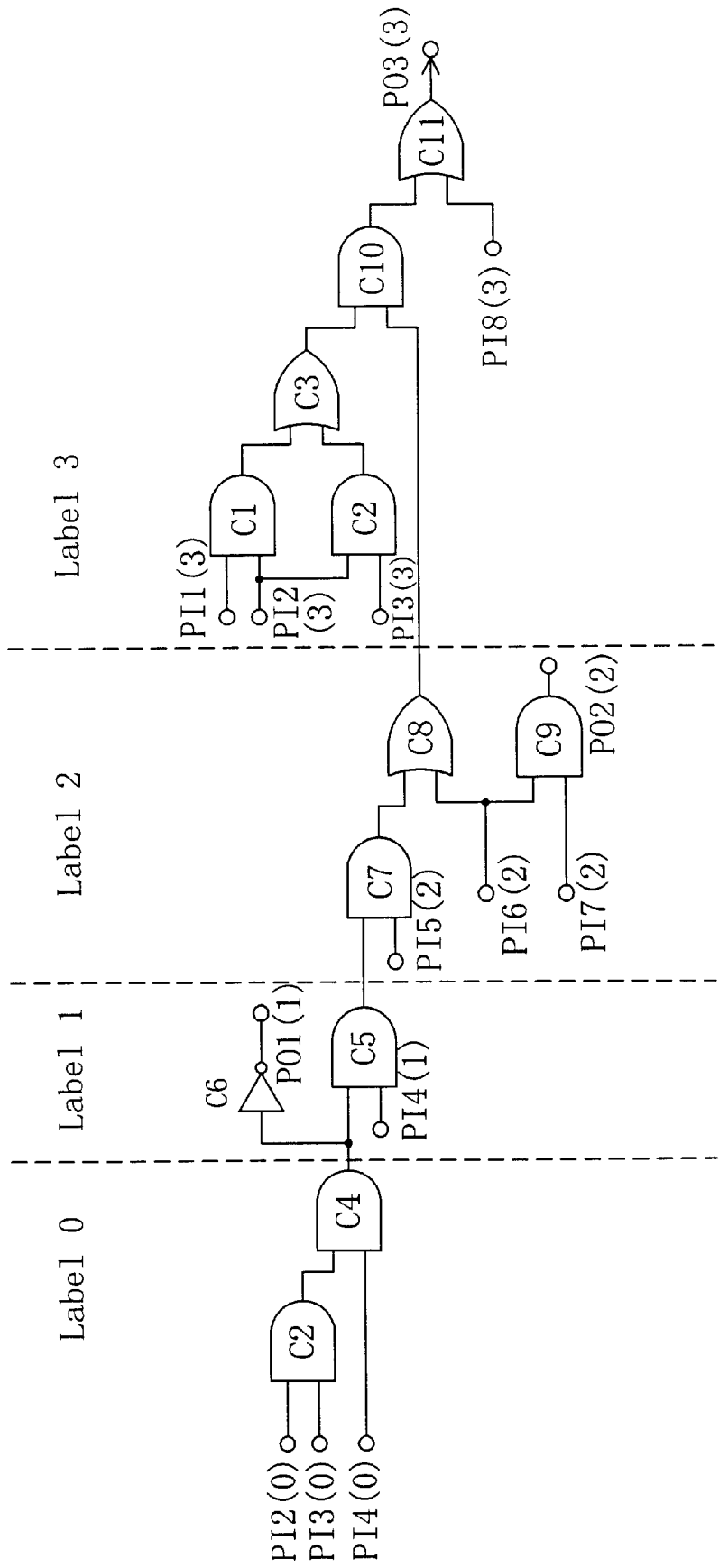
Figure 45:
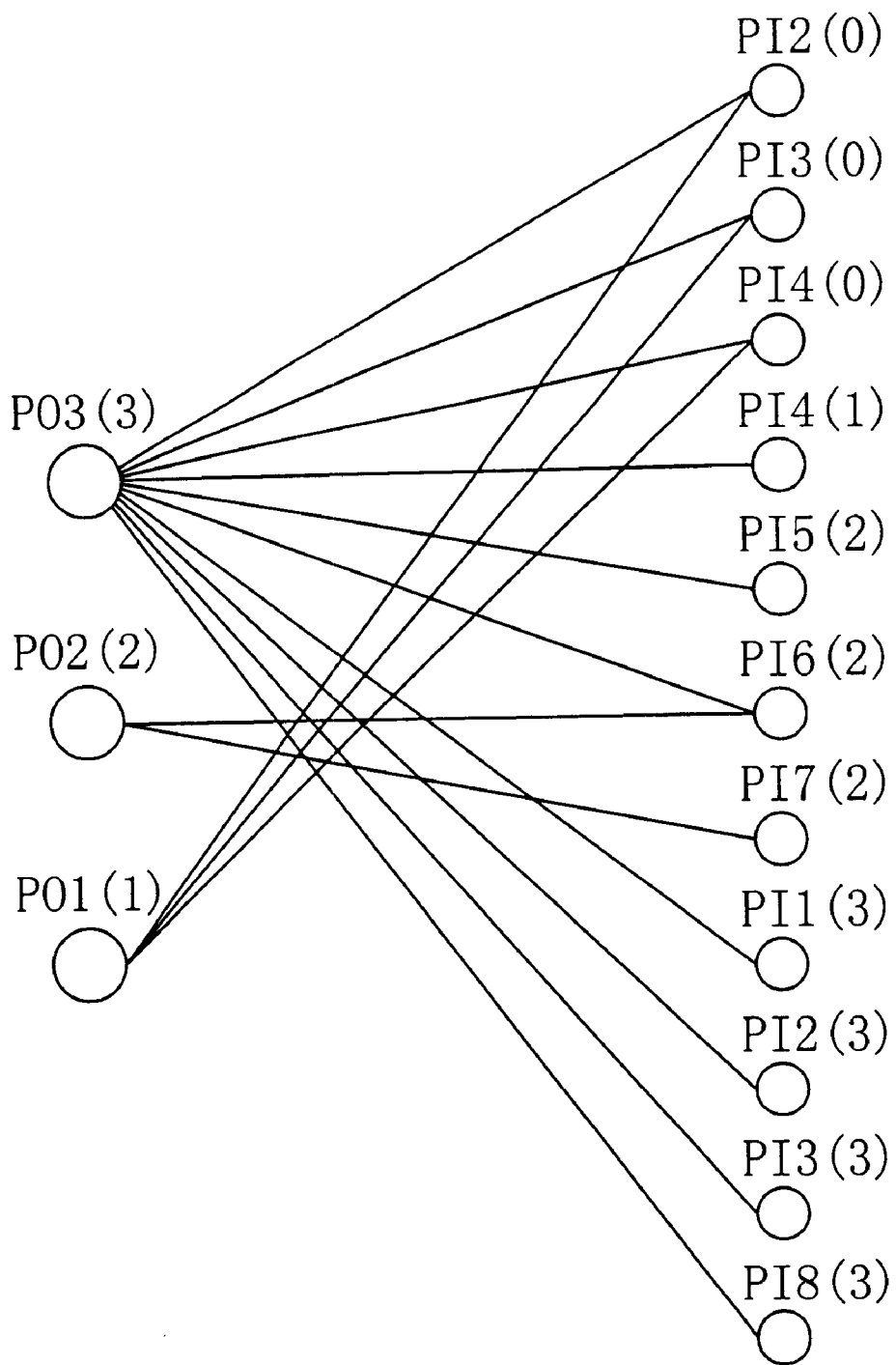
Figure 48:
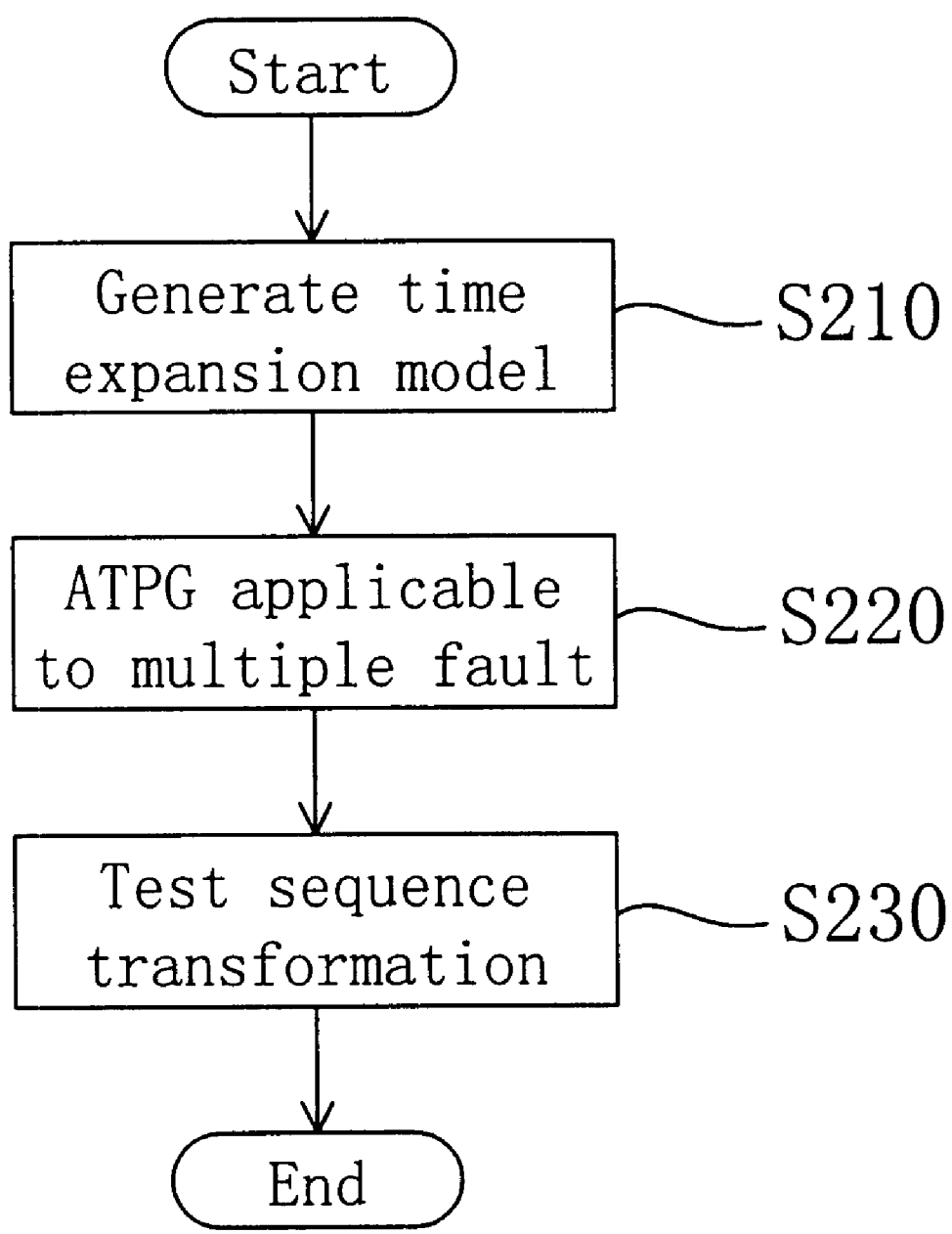

a FIG. 9 is a compatibility table obtained by collecting results of the compaction trials;

FIG. 10(a) is a compatibility graph representing the compatibility table of FIG. 9 by using an undirected graph and FIG. 10(b) is a diagram for showing a process for extracting a maximum clique (partial complete graph) from the compatibility graph of FIG. 10(a);

FIG. 11 is a diagram for showing a process for generating a compaction template based on a compaction set;

FIG. 12 is a diagram for showing a process for obtaining a maximum overlap length;

Figures 13A, 13B, 13C:
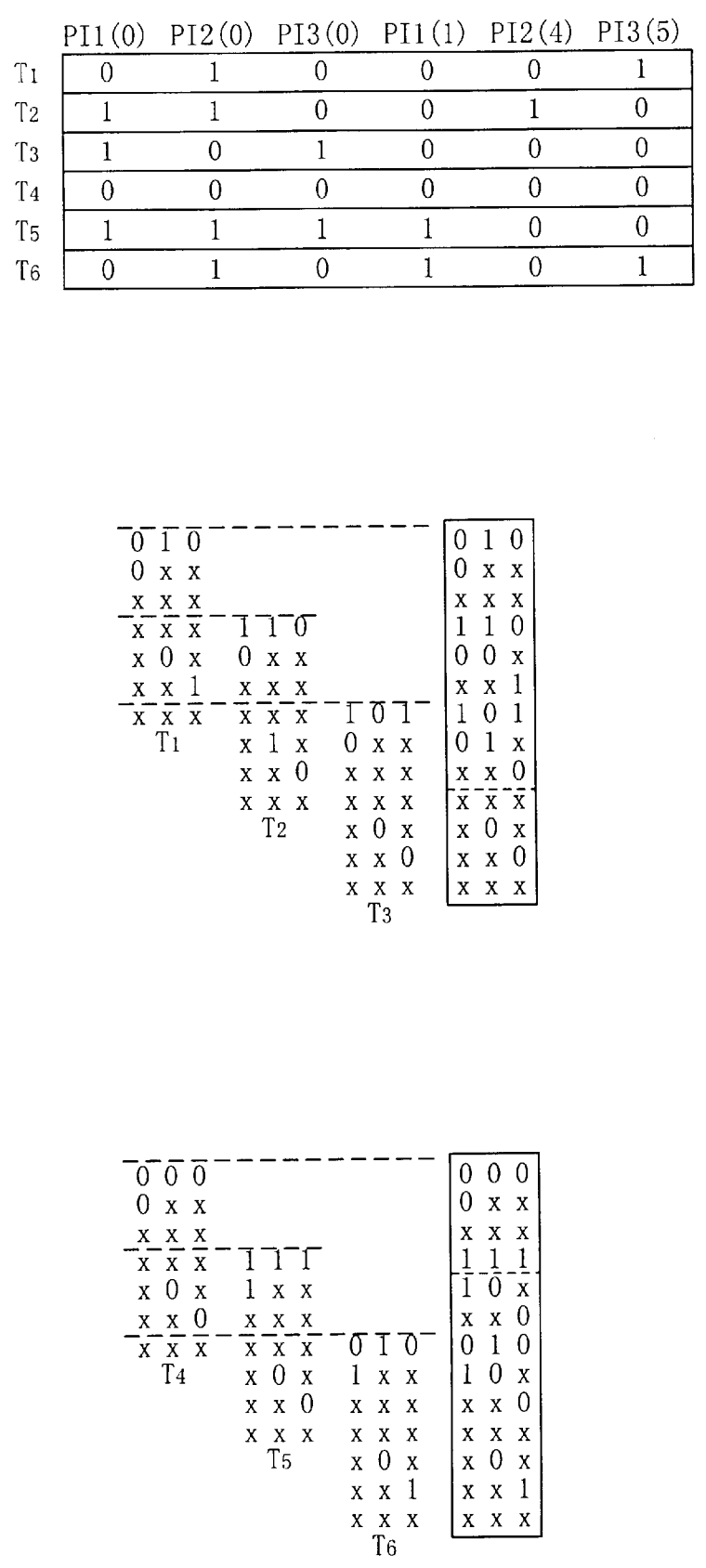

FIGS. 13(a) through 13(c) are diagrams for explaining test sequence transformation according to Embodiment 1 of the invention, wherein FIG. 13(a) shows test patterns T1 through T6 exemplified as targets of the test sequence transformation, FIG. 13(b) shows test sequences generated from the test patterns T1 through T3 and FIG. 13(c) shows test sequences generated from the test patterns T4 through T6;

FIG. 14 shows test sequences generated from the test patterns of FIG. 13(a) in Embodiment 1;

FIG. 15 is a flowchart for showing procedures of test sequence transformation in a method of generating test sequences according to Embodiment 2 of the invention;

Figure 16:
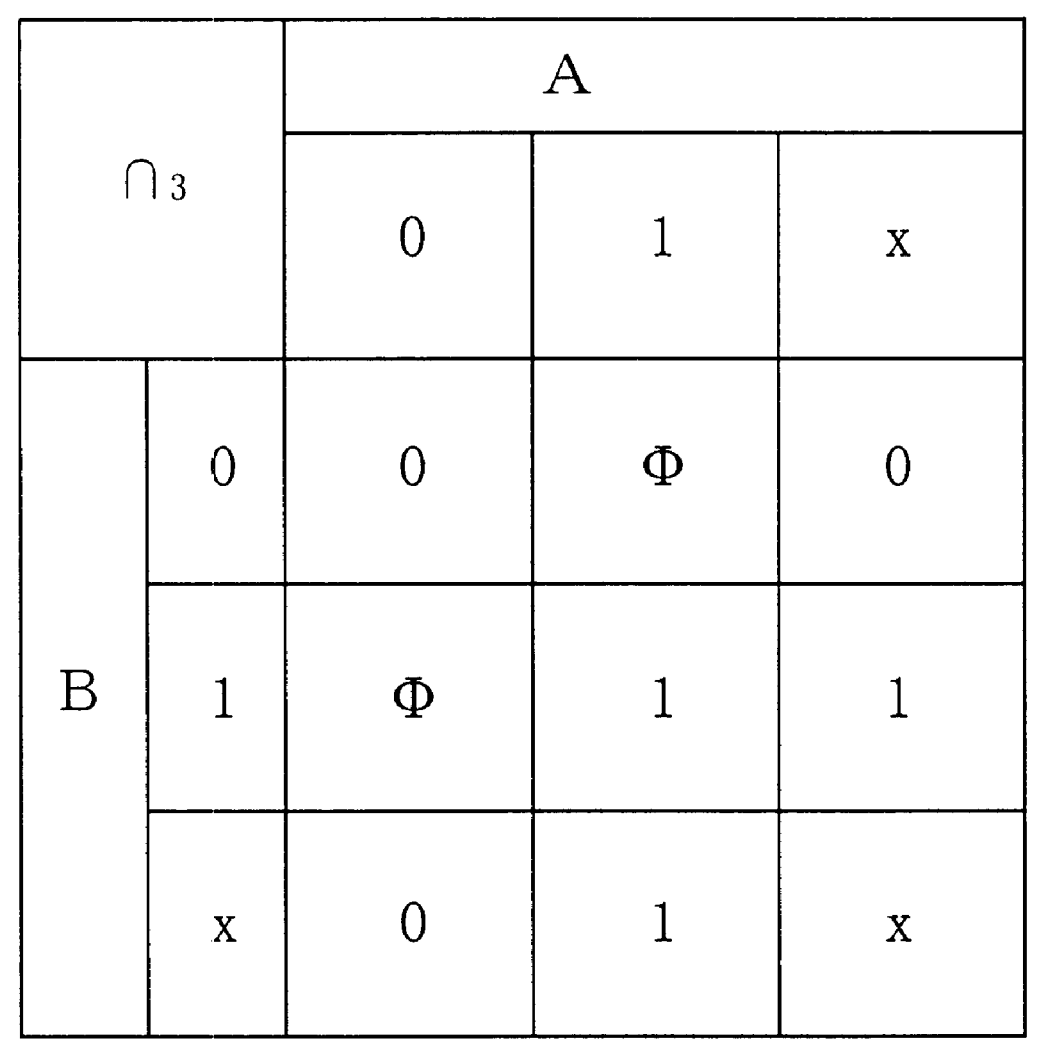

FIG. 16 is a diagram for showing a compaction operation used in Embodiment 2;

FIGS. 17(a) through 17(e) are diagrams for explaining the test sequence transformation of Embodiment 2;

FIG. 18 shows test sequences generated from the test patterns of FIG. 13(a) in Embodiment 2;

FIG. 19 is a flowchart for showing procedures in a method of generating test sequences according to Embodiment 3 of the invention;

FIG. 20(a) is a flowchart for showing detailed procedures in step S70 of FIG. 19 and FIG. 20(b) is a flowchart for showing detailed procedures in step S80 of FIG. 19;

FIG. 21 is a diagram, used for explaining Embodiment 3, of test sequences generated from the test patterns T1 through T3 of FIG. 13(a) by using a compaction template;

FIGS. 22(a) and 22(b) are diagrams for explaining reverse transformation of the test sequences of FIG. 21, wherein FIG. 22(a) shows the reverse transformation in time 1 and FIG. 22(b) shows the reverse transformation in time 2;

FIGS. 23(a) and 23(b) are diagrams used for explaining Embodiment 3, wherein FIG. 23(a) shows test sequences generated from the test patterns T1 through T3 of FIG. 13(a) by using a ternary compaction operation and FIG. 23(b) shows reverse transformation of the test sequences of FIG. 23(a);

FIG. 24 is a flowchart for showing procedures in a method of generating test sequences according to Embodiment 4 of the invention;

FIG. 25 is a flowchart for showing detailed procedures in a compaction step S105 of FIG. 24;

FIG. 26 is a flowchart for showing detailed procedures in a test sequence transformation step S109 of FIG. 25;

FIG. 27 is a diagram of contents of a test pattern compaction buffer;

FIG. 28 is another diagram of contents of the test pattern compaction buffer;

FIG. 29 is still another diagram of contents of the test pattern compaction buffer;

FIG. 30 is a diagram of test sequences for an entire acyclic sequential circuit;

FIG. 31 is a diagram of contents of the test pattern compaction buffer;

FIG. 32 is another diagram of test sequences for the entire acyclic sequential circuit;

FIG. 33 is a diagram for showing a result of reverse transformation;

FIG. 34 is a diagram of contents of the test pattern compaction buffer;

FIG. 35 is a diagram of test sequences for the entire acyclic sequential circuit;

FIG. 36 is a diagram of contents of the test pattern compaction buffer;

FIG. 37 is a flowchart for showing procedures in a method of generating test sequences according to Embodiment 5 of the invention;

FIG. 38 is a diagram of an acyclic sequential circuit exemplified as a target in Embodiment 5;

FIG. 39 is a diagram of a time expansion model generated from the acyclic sequential circuit of FIG. 38;

FIG. 40 is a diagram of test sequences obtained in Embodiment 5;

FIG. 41 is a diagram for showing a result of compaction of the test sequences of FIG. 40;

FIG. 42 is a flowchart for showing procedures in a method of generating test sequences according to Embodiment 6 of the invention;

FIG. 43 is a diagram of an acyclic sequential circuit exemplified as a target in Embodiment 6;

FIG. 44 is a diagram of a time expansion model generated from the acyclic sequential circuit of FIG. 43;

FIG. 45 is an undirected graph representing the relationship in reach between primary inputs and primary outputs in the time expansion model of FIG. 44;

FIG. 46 is a diagram of test sequences obtained in Embodiment 6;

FIG. 47 is a diagram for showing a result of compaction of the test sequences of FIG. 46; and FIG. 48 is a flowchart for showing procedures in a conventional method of generating test sequences.

DETAILED DESCRIPTION OF THE INVENTION

Now, embodiments of the present invention will be described with reference to the accompanying drawings.

Embodiment 1

Figure 1:
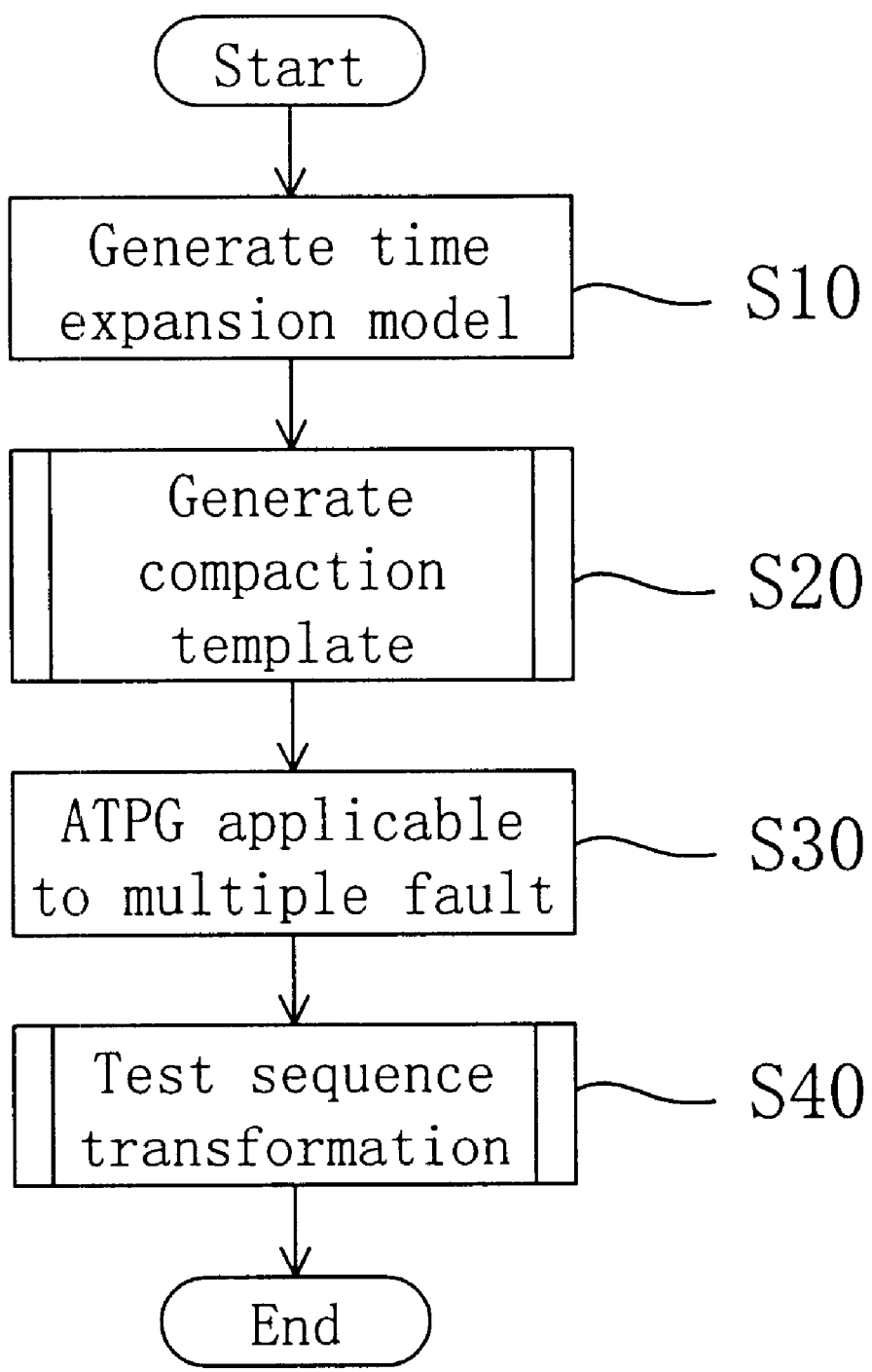
FIG. 1 is a flowchart for showing procedures in a method of generating test sequences according to Embodiment 1 of the invention.

FIG. 1 is a flowchart for showing procedures in a method of generating test sequences according to Embodiment 1 of the invention. As is shown in FIG. 1, an acyclic sequential circuit or an integrated circuit designed as a sequential circuit having an acyclic structure in testing through partial scan design is subjected to timeframe expansion so as to generate a time expansion model (combinational circuit) in step S10, and one or more primitive templates generated from the time expansion model are compacted to generate a compaction template in step S20. In step S30, test patterns applicable to a single or multiple fault are generated with respect to the time expansion model generated in step S10 and fault simulation is executed by using the generated test patterns for the purpose of generating test sequences to be used for detecting faults in the integrated circuit. In step S40, the test patterns generated in step S30 are transformed into test sequences applicable to the original integrated circuit.

Figure 2:
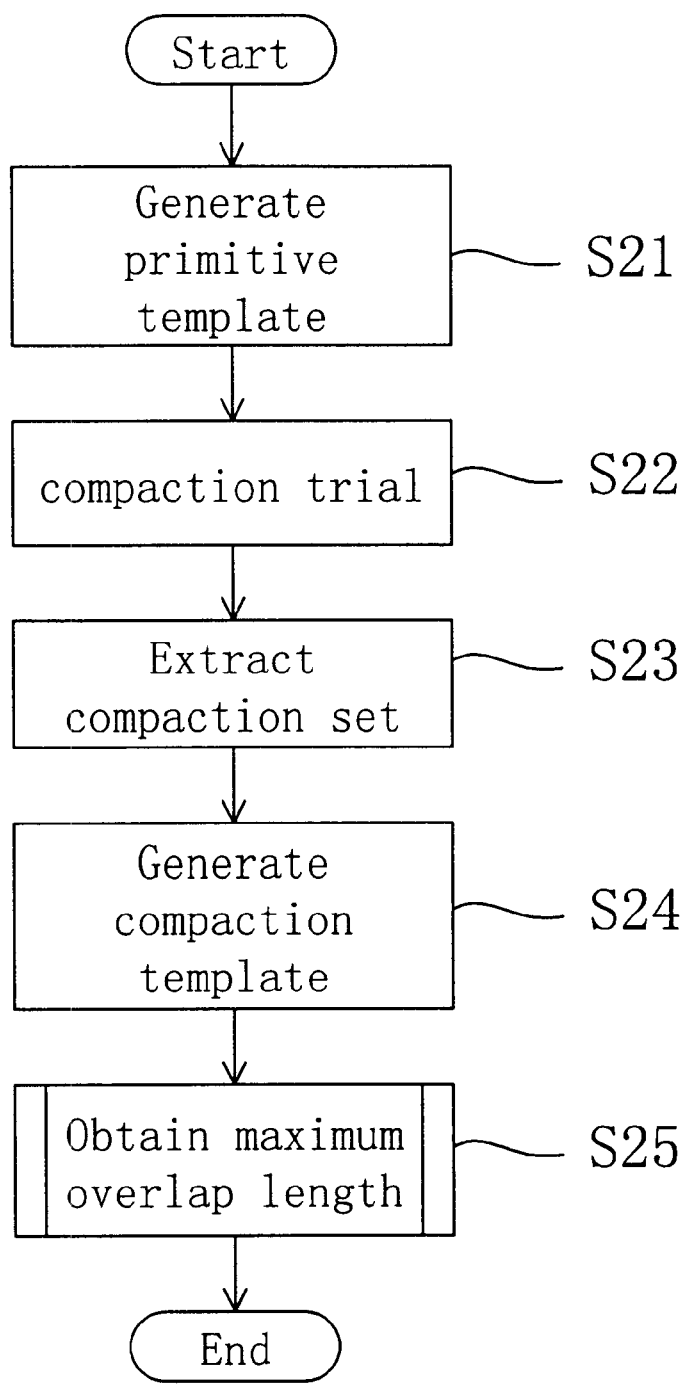
FIG. 2 is a flowchart for showing detailed procedures in step S20 of FIG. 1.
Figure 3:
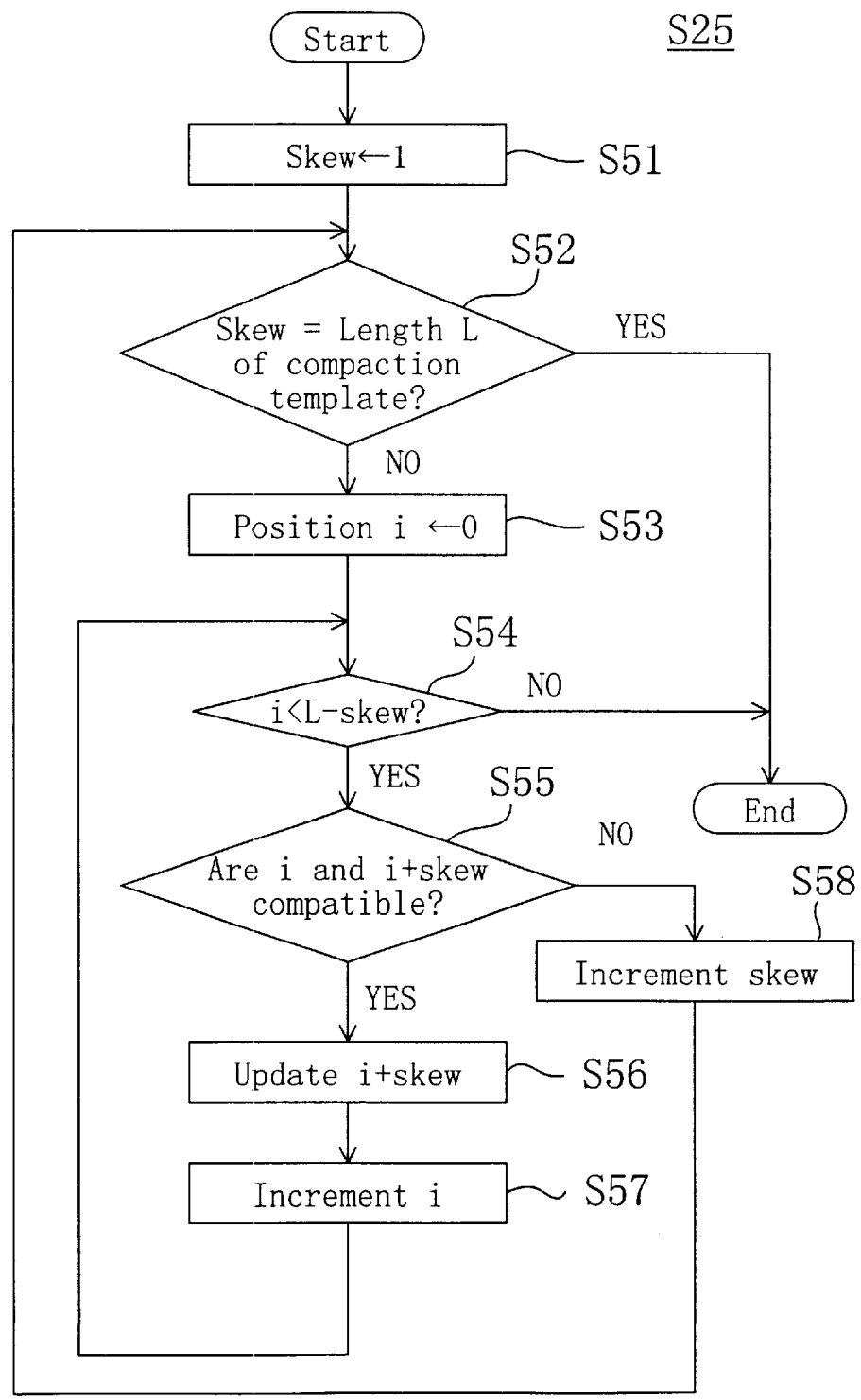
FIG. 3 is a flowchart for showing detailed procedures in step S25 of FIG. 2.
Figure 4:
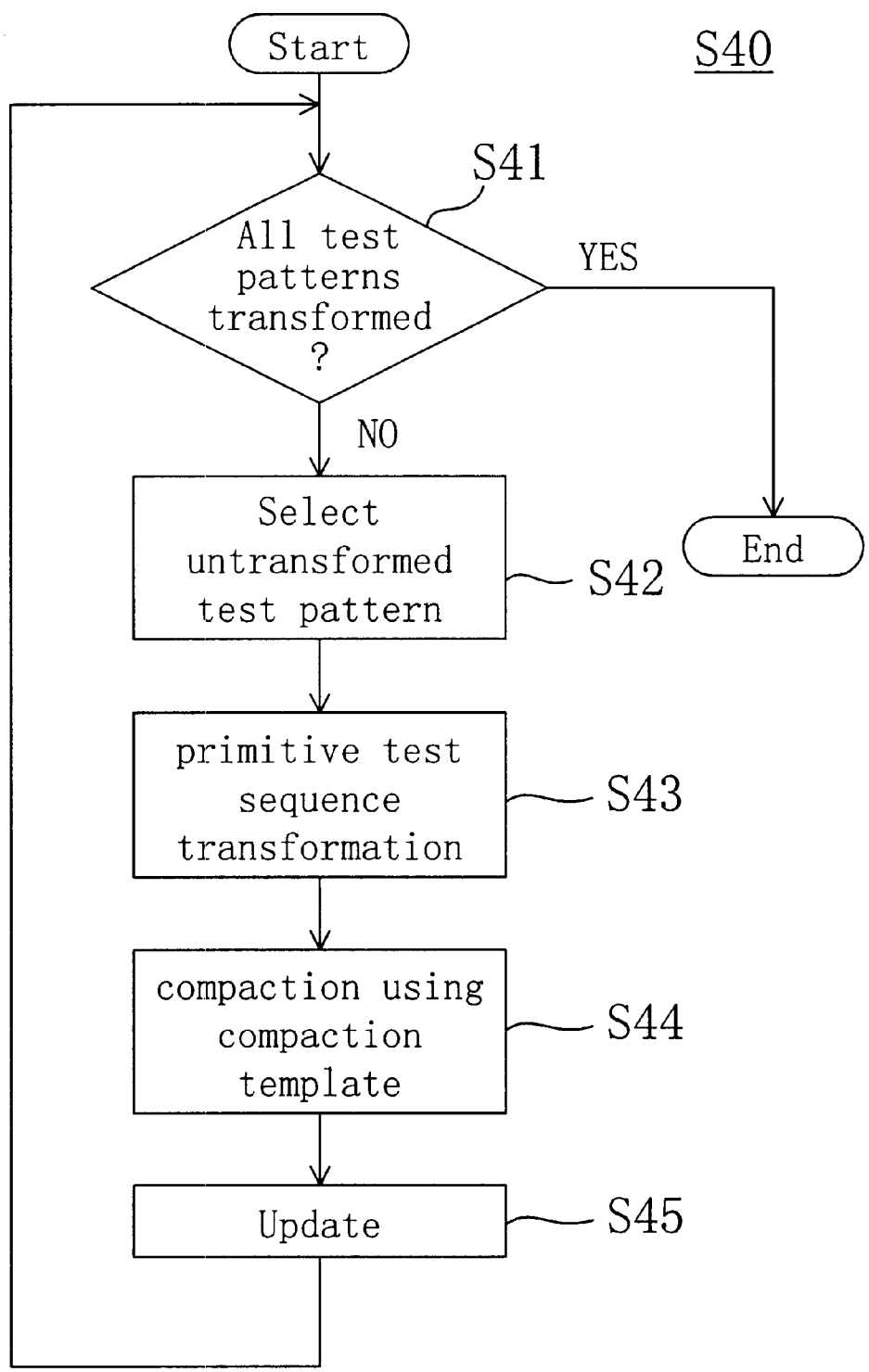
FIG. 4 is a flowchart for showing detailed procedures in step S40 of FIG. 1.

FIGS. 2 and 3 are flowcharts for showing detailed procedures in step S20 of FIG. 1, and FIG. 4 is a flowchart for showing detailed procedures in step S40 of FIG. 1.

The method of generating test sequences of this embodiment will now be described on the basis of the flowcharts of FIGS. 1 through 4 by exemplifying a specific circuit with reference to FIGS. 5 through 14.

Figure 5A:
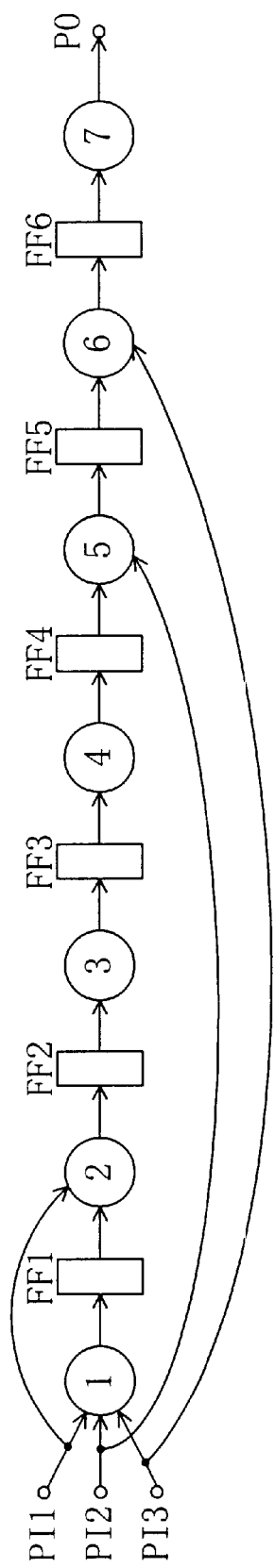
FIG. 5(a) shows a sequential circuit exemplified as a target of test sequence generation and FIG. 5(b) shows a time expansion model generated from the sequential circuit of FIG. 5(a)

FIG. 5(a) shows a sequential circuit exemplified as a target of test sequence generation in this embodiment. The sequential circuit of FIG. 5(a) is an acyclic sequential circuit having no loops. In FIG. 5(a), reference numerals 1 through 7 denote combinational circuits, FF1 through FF6 indicate flipflops (FFs), PI1 through PI3 indicate primary inputs and PO indicates a primary output.

Figure 5B:
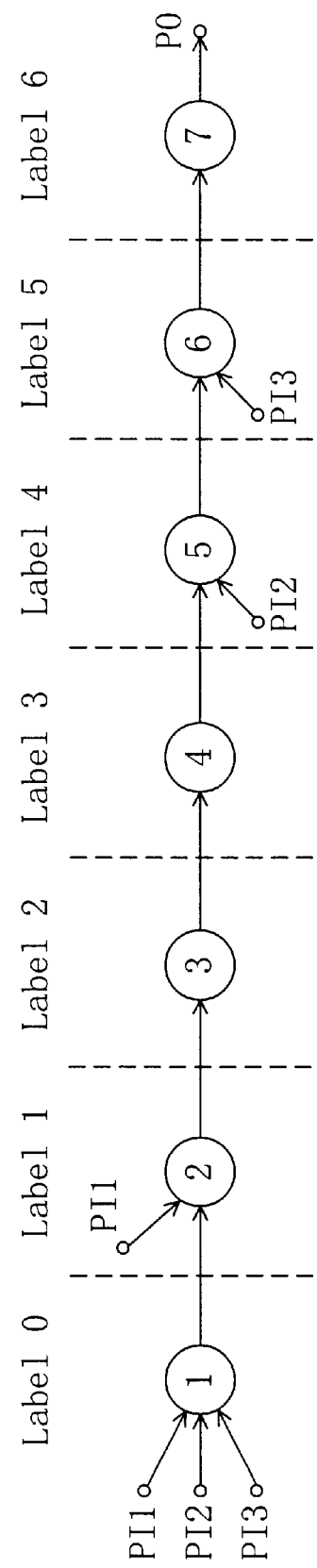

First, in step S10, the sequential circuit of FIG. 5(a) is subjected to timeframe expansion, so as to generate a time expansion model, that is, a combinational circuit. FIG. 5(b) shows the time expansion model generated with respect to the sequential circuit of FIG. 5(a). In the time expansion model of FIG. 5(b), the primary input PI1 is present in labels 0 and 1, the primary input PI2 is present in labels 0 and 4 and the primary input PI3 is present in labels 0 and 5.

Next, in step S20, a compaction template is generated with respect to the time expansion model of FIG. 5(b).

Specifically, in step S21 (see FIG. 2), a primitive template is generated. A "primitive template" herein means information indicating whether or not a primary input or a pseudo primary input is present in each label of a time expansion model.

FIG. 6 is a primitive template generated with respect to the time expansion model of FIG. 5(b). In FIG. 6, each row corresponds to a time corresponding to each label of the time expansion model, and each column corresponds to a primary input or a pseudo primary input. In a primitive template, "b" indicates that the corresponding primary input is present in a label in the time expansion model corresponding to the time of the row, and "X" indicates that the corresponding primary input is not present in a label in the time expansion model corresponding to the time of the row. For example, the row corresponding to time 1 of the primitive template of FIG. 6 lists "b X X", which means that the primary input PI1 is present in label 1 but the primary inputs PI2 and PI3 are not present in label 1 in the time expansion model.

Next, in step S22, it is determined whether or not the primitive template generated in step S21 can be overlapped itself with times shifted, namely, it is tried whether or not two primitive templates with values set on the skew can be compacted. Herein, "skew" corresponds to a shift of times.

FIG. 7 shows a compaction operation $\cap_2$ defined in this embodiment to be conducted on data A and B of arbitrary two primitive templates each having either of two values "b" and "X". When not $A\cap_2 B \ni \Phi$, the data A and B are not compatible. Specifically, when the data A and B are both "b", they are not compatible, and when one of them is "X", they are compatible as is shown in FIG. 7. The compaction operation $\cap_2$ is executed on two primitive templates, and it is determined whether or not the primitive templates are compatible with respective skew values based on whether or not the result of the compaction includes "$\Phi$".

FIGS. 8(a) through 8(f) show compaction trials executed on the primitive template of FIG. 6 with the skew value changed from 1 to 6, respectively. When the skew value is 1, 4 or 5, it is determined that the primitive templates are not compatible because the result of the compaction operation includes "$\Phi$" as is shown in FIGS. 8(a), 8(d) or 8(e). On the other hand, when the skew value is 2, 3 or 6, it is determined that the primitive templates are compatible because the result of the compaction operation does not include "$\Phi$" as is shown in FIGS. 8(b), 8(c) or 8(f). The primitive template of FIG. 6 has a length of 7, and hence, the skew value is set to 1 through 6.

FIG. 9 is a compatibility table obtained by collecting the results of the compaction trials of FIGS. 8(a) through 8(f). In FIG. 9, both the row and column correspond to labels of the primitive template. Also, "1" indicates that the primitive templates are compatible by setting the skew value to an absolute value of a difference between the labels of the row and the column, and "0" indicates that the primitive templates are not compatible.

Next, in step S23, a compatibility graph is generated on the basis of the results of the compaction trials of step S22, and a compaction set is obtained by extracting a maximum clique (partial complete graph) from the compatibility graph.

FIG. 10(a) shows a compatibility graph representing the compatibility table of FIG. 9 by using an undirected graph. Nodes of the compatibility graph correspond to the primitive template, each node has a label, and each edge indicates that the primitive templates are compatible by setting the skew value to a difference between labels of nodes at both ends of the edge.

FIG. 10(b) is a diagram for explaining extraction of a maximum clique (partial complete graph) from the compatibility graph of FIG. 10(a). In FIG. 10(b), V denotes a compaction set including, as elements, nodes included in a clique.

At this point, each edge of the compatibility graph is weighted. Assuming that a weight given to an edge (u, v) (wherein u and v correspond to nodes at the ends of the edge) is indicated as w (u, v), a set of nodes adjacent to a node u is indicated as nbr(u), a set of nodes adjacent to the node v is indicated as nbr(v) and sets A and B are represented as follows:

$$A=nbr(u)-\{v\}$$

$$B=nbr(v)-\{u\}$$

the weight w (u, v) is obtained as follows:

$$w(u, v)=|A \cup B|-|A \cap B|$$

First, the compaction set V is initialized. Herein, on the basis of heuristic knowledge, a node of label 0 (i.e., node 0) is initially set as the element of the compaction set V. Next, one node connected with the node 0 is selected to be added to the compaction set V. The nodes connected with the node 0 are nodes 2, 3 and 6 corresponding to "1" listed in the row of label 0 of the compatibility table. Herein, one of the nodes having a smallest weight in the edge connected with the node 0 is selected to be added to the compaction set V. Owing to such node selection, there is a good chance that the compaction set V includes a larger number of elements. The nodes 2, 3 and 6 connected with the node 0 respectively have a weight of 4, 3 and 2 in the edges connected with the node 0, and hence, the node 6 having the smallest weight is herein selected to be added to the compaction set V.

Next, a node that can be compacted commonly with the nodes 0 and 6 that are the elements of the compaction set V is searched for. The search for a commonly compatible node is conducted through an AND operation between rows corresponding to labels 0 and 6 of the compatibility table of FIG. 9. As a result of the AND operation, a node 3 is retrieved as the node commonly compatible with the nodes 0 and 6. The node 3 is added to the compaction set V. Similarly, a node that can be compacted commonly with the nodes 0, 3 and 6 included in the compaction set V is further searched for through the AND operation. Since there is no commonly compatible node, the compaction set V is defined to include the nodes 0, 3 and 6 as its elements, and the process is completed. As a result, the maximum clique including the nodes 0, 3 and 6 is extracted from the compatibility graph of FIG. 10(a).

When there are plural compatible nodes, a node having a larger number of edges can be selected. Alternatively, a node of smaller label can be selected in order to shorten the length of the compaction template as far as possible. Furthermore, the number of nodes included in the compatibility graph can be increased by providing "X X X" in labels 7 and more as the test patterns with respect to the primitive template.

Next, in step S24, a compaction template is generated on the basis of the primitive template generated in step S21 and the compaction set obtained in step S23. FIG. 11 is a diagram for illustrating generation of a compaction template. Since the compaction set V includes the labels 0, 3 and 6 as the elements, the compaction operation $\cap_2$ is executed on three primitive templates by setting the skew values to 3 and 6, that is, differences between label 0 and the other labels 3 and 6, as is shown in FIG. 11. A template resulting from the compaction operation $\cap_2$ is used as the compaction template. In FIG. 11, the compaction template with a length of 13 is generated.

Next, in step S25, a maximum overlap length is obtained in the compaction template generated in step S24. A "maximum overlap length" is, in connecting compaction templates, the largest one of overlap lengths, that is, lengths where the compaction templates can be overlapped. An overlap length corresponds to a value obtained by subtracting a skew value from the length of a compaction template.

The maximum overlap length is obtained in accordance with the flowchart shown in FIG. 3. First, the skew value is initialized to 1 (S51). A compaction point i (wherein i indicates time in the compaction template) is initialized to "0" (S53), and it is determined whether or not a test pattern at the compaction point i and a test pattern at the compaction point i +the skew value are compatible (S55). When they are compatible, the test pattern at the compaction point i+the skew value is updated to a compaction result of step S55 (S56), and the compaction point i is incremented (S57), and the procedure returns to step S54. When they are not compatible, the skew value is incremented (S58), and the procedure returns to step S52. When the compaction pont i exceeds a value corresponding to the length L of the compaction template—the skew value in step S54, the maximum overlap length is defined as the value corresponding to the length L of the compaction template—the skew value, and the process is completed. By repeating these procedures, when the skew value becomes equal to the length L of the compaction template, the maximum overlap length is defined as "0" and the process is completed (S52).

FIG. 12 is a diagram for explaining the process for obtaining the maximum overlap length, showing a process for determining whether or not the compaction template of FIG. 11 can be endlessly repeatedly compacted when the skew value is 9, namely, the overlap length is 4. With respect to the skew value of 1 through 8, it is already determined that the template cannot be endlessly repeatedly compacted.

As is shown in FIG. 12, first, the skew value is set to 9 (S51), and the compaction point i is initialized to "0" (S53). A test pattern "b b b" in time 0 of the compaction template and a test pattern "X X X" in time 9 (=0+the skew value) are compacted, and the test pattern in time 9 is updated to "b b b" resulting from the compaction (S55 and S56). Next, the compaction point i is set to "1" (S53), and a test pattern "b X X" in time 1 of the compaction template and a test pattern "X b X" in time 10 (=1+the skew value) are compacted, and the test pattern in time 10 is updated to "b b X" resulting from the compaction (S55 and S56). Subsequently, the compaction point i is set to "2" (S53), and a test pattern "X X X" in time 2 and a test pattern "X X b" in time 11 (=2+the skew value) are compacted, and the test pattern in time 11 is updated to "X X b" resulting from the compaction (S55 and S56). Then, the compaction point i is set to "3" (S53), and a test pattern "b b b" in time 3 and a test pattern "X X X" in time 12 (=3+the skew value) are compacted, and the test pattern in time 12 is updated to "b b b" resulting from the compaction. Next, the compaction point i is set to "4", but 4 is not smaller than the length L of the compaction template—the skew value (=4), and hence, the process is completed (S54). As a result, the maximum overlap length of the compaction template of FIG. 11 is found to be "4".

Next, in step S40, test sequence transformation is conducted by using the compaction template. Herein, a process for transforming one test pattern generated for detecting a fault set in the time expansion model into a test sequence applicable to the original sequential circuit is defined as "basic test sequence transformation". Also, a test sequence generated through the basic test sequence transformation is defined as a "basic test sequence".

FIGS. 13(a) through 13(c) are diagrams for explaining procedures of the test sequence transformation in step S40. FIG. 13(a) shows examples of test patterns to be transformed into test sequences in the time expansion model, wherein T1 through T6 indicate test patterns, PI1(0), PI2(0) and PI3(0) indicate the primary inputs PI1, PI2, PI3 in label 0 of the time expansion model, PI1(1), PI2(4) and PI3(5) indicate the primary input PI1 in label 1, the primary input PI2 in label 4 and the primary input PI3 in label 5, respectively.

As is shown in FIG. 4, the following procedures are repeatedly executed until all the test patterns are transformed into test sequences (S41). In step S42, a test pattern not transformed yet is selected. Herein, test patterns in the same number as the number of the primitive templates from which the compaction template is generated are selected. Since the compaction template of FIG. 11 is generated from the three primitive templates, three test patterns are selected at a time.

As is shown in FIG. 13(b), the selected test patterns T1 through T3 are subjected to the basic test sequence transformation (S43). Three basic test sequences thus generated are compacted by using the compaction template, so as to generate test sequences with a length of 13 (S44). In other words, the three test patterns T1 through T3 are substituted in the compaction template of FIG. 11. Next, as is shown in FIG. 13(c), the selected test patterns T4 through T6 are subjected to the basic test sequence transformation (S43), and three basic test sequences thus generated are compacted by using the compaction template, so as to generate test sequences with a length of 13 (S44).

Then, in step S45, the generated test sequences (shown in FIG. 13(c)) are connected with the test sequences already generated (shown in FIG. 13(b)) by overlapping them by the maximum overlap length of 4, thereby generating new test sequences. FIG. 14 shows test sequences generated in this embodiment from the test patterns of FIG. 13(a). In this manner, test sequences with a length of 22 can be generated by the method of generating test sequences of this embodiment.

When the number of test patterns is indicated as T, a test sequence generated through the compaction using the compaction template of this embodiment has a length obtained as follows:

$$(13-4) \times (T/3) + 4 = 3T + 4$$

On the other hand, when the compaction is not conducted at all, a resultant test sequence has a length of 7T.

In this manner, according to this embodiment, a compaction template with high compaction efficiency is generated and respective test patterns are substituted in the compaction template so as to be connected to generate test sequences. Accordingly, short test sequences can be efficiently generated without spending much time on compaction. Also, since compaction templates are overlapped by a maximum overlap length in connecting the compaction templates, the resultant test sequences can be made further shorter.

Embodiment 2

In Embodiment 2 of the invention, compaction in accordance with a compaction operation using three values of "don't care", "0" and "1" is additionally conducted in a test sequence transformation step S230 of a conventional method of generating test sequences shown in FIG. 48. FIG. 15 is a flowchart for showing procedures in a test sequence transformation step of a method of generating test sequences according to Embodiment 2 of the invention.

As is shown in FIG. 15, the following procedures are repeatedly conducted until all test patterns generated with respect to a time expansion model are transformed into test sequences (S61). One test pattern not transformed yet is selected (S62), and the selected test pattern is subjected to the basic test sequence transformation (S63). A compaction point i is successively incremented from 0 (S64 and S67), and it is determined whether or not the resultant basic test sequence is compatible with an already generated test sequence in accordance with the ternary compaction operation at the compaction point i (S65). When the basic test sequence is compatible, the test sequence is updated in accordance with the result of the compaction (S66).

FIG. 16 shows the compaction operation $\cap_3$ conducted in this embodiment on arbitrary test pattern data A and B each having any of the three values, "0", "1" and "X". When not $A \cap_3 B \ni \Phi$, the data A and B are compatible. Specifically, as is shown in FIG. 16, when one of the data A and B is "1" and the other is "0", they are not compatible, and in other cases, they are compatible.

Now, the method of generating test sequences according to this embodiment will be described with reference to FIGS. 17(a) through 17(e) and 18 by exemplifying test sequence generation from the test patterns of FIG. 13(a).

Figures 17, 17C:
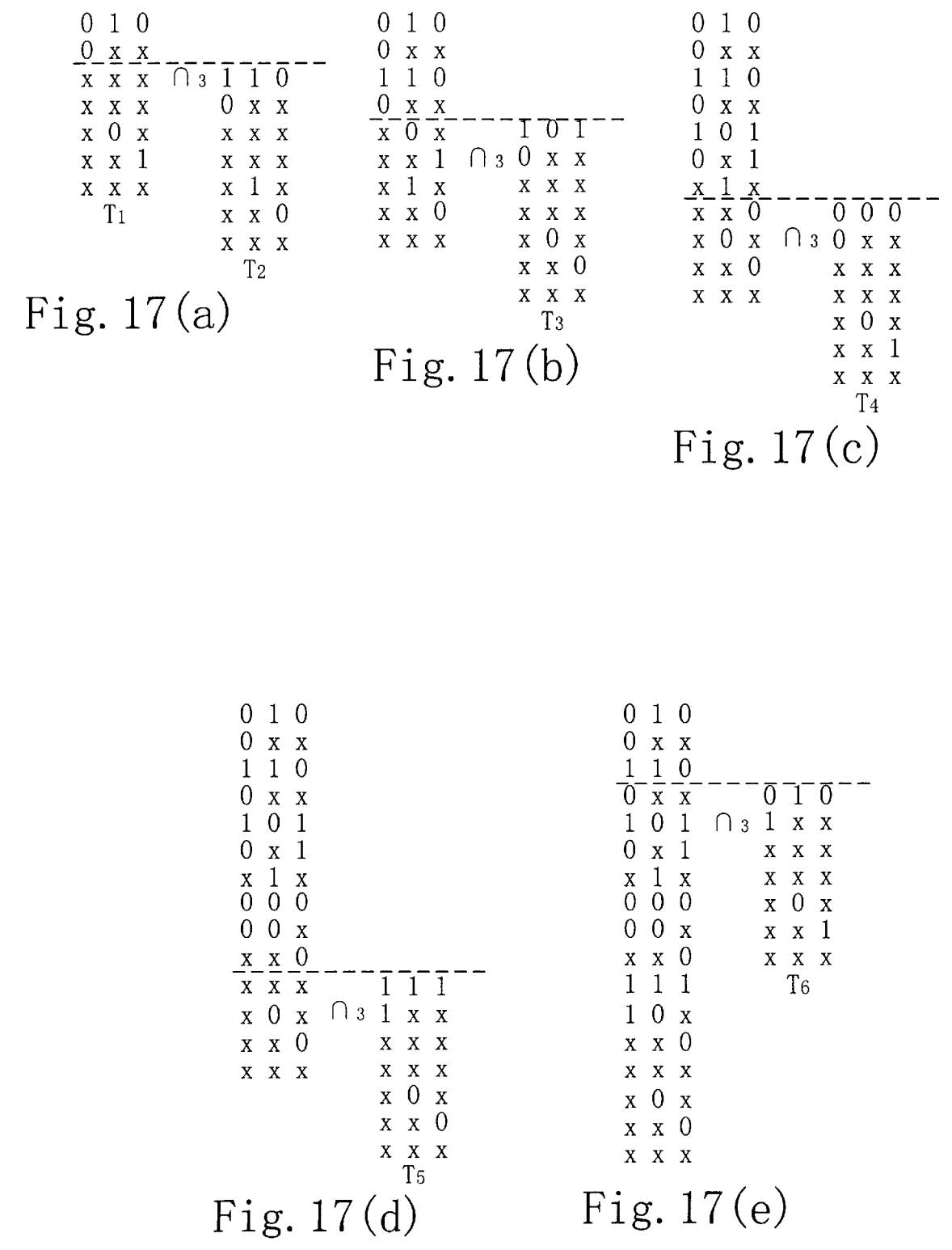

First, the test pattern T1 is subjected to the basic test sequence transformation. Next, as is shown in FIG. 17(a), the test pattern T2 is subjected to the basic test sequence transformation, and it is determined whether or not the generated basic test sequence is compatible with the test sequence obtained from the test pattern T1 with the skew value successively changed from 0. Since the basic test sequence is compatible when the skew value is 2, the test sequence is updated through the compaction. Then, as is shown in FIG. 17(b), the test pattern T3 is subjected to the basic test sequence transformation, and it is determined whether or not the generated basic test sequence is compatible with the test sequence obtained from the test patterns T1 and T2 with the skew value successively changed from 0. Since the basic test sequence is compatible when the skew value is 4, the test sequence is updated through the compaction. Similarly, as is shown in FIGS. 17(c) through 17(e), the test sequence is updated by compacting basic test sequences generated from the test patterns T4 through T6.

FIG. 18 shows test sequences generated according to this embodiment from the test patterns of FIG. 13(a). Thus, a test sequence with a length of 17 is generated by the method of generating test sequences of this embodiment.

In this manner, according to Embodiment 2, the length of a test sequence for a sequential circuit can be efficiently shortened through the compaction using the ternary compaction operation in the test sequence transformation.

Embodiment 1 can attain more preferable results than Embodiment 2 in some cases. Specifically, simultaneous compaction of plural templates can attain more preferable results than compacting templates one by one in some cases.

Embodiment 3

In Embodiment 3 of the invention, a test sequence is compacted through reverse transformation of the test sequence. Herein, a process for generating a test pattern for a time expansion model from a test sequence for a sequential circuit by using a primitive template is defined as "reverse basic test sequence transformation". The reverse transformation of a test sequence of this embodiment is executed by conducting the reverse basic test sequence transformation.

FIG. 19 is a flowchart for showing procedures in a method of generating test sequences according to Embodiment 3 of the invention. First, a time expansion model is generated from a target integrated circuit (S61). A check pattern number i for counting the number of test patterns is initialized to "0" (S62). Then, the following procedures are repeatedly executed until test patterns are generated with respect to all undetected faults (S63). One undetected fault for which a test pattern is not generated is selected as a target fault (S64), and a test pattern is generated for this target fault (S65). Fault simulation is executed by using the generated test pattern (S66). Then, after the check pattern number i is incremented (S67) and step S70 is executed, it is determined whether or not the check pattern number i is equal to a constant n (S68). When they are equal to each other, after executing step S80, the check pattern number i is initialized to "0" (S69), and the procedure returns to step S63. When not, the procedure directly returns to step S63. When this embodiment is combined with the compaction using a compaction template of Embodiment 1, the constant n is equal to the number of primitive templates used for obtaining the compaction template. When this embodiment is combined with the ternary compaction operation of Embodiment 2, the constant n is an arbitrary value. After generating test patterns with respect to all the faults, the process is completed.

FIG. 20(a) is a flowchart for showing procedures in step S70 of FIG. 19, and FIG. 20(b) is a flowchart for showing procedures in step S80 of FIG. 19. In step S70, n test patterns are subjected to the basic test sequence transformation (S71) and the compaction is conducted (S72). In step S80, a new test pattern is generated through the reverse basic test sequence transformation (S81) and the fault simulation is executed (S82).

Now, the method of generating test sequences of this embodiment will be described with reference to FIGS. 21, 22(a) and 22(b) by exemplifying the case where the compaction through the reverse transformation of a test sequence is combined with the compaction by using a compaction template of Embodiment 1. It is assumed that the primitive template of FIG. 6 and the compaction template of FIG. 11 have already been generated and that the maximum overlap length has been defined as "4".

FIG. 21 shows test sequences generated from the test patterns T1 through T3 of FIG. 13(a) by using the compaction template. In this embodiment, each time of the test sequence for the sequential circuit is provided with a simulation flag for indicating whether or not fault simulation has been executed by using a test pattern generated from a test sequence of that time through the reverse transformation. As is shown in FIG. 21, time where the fault simulation has already been executed is marked with a check. Since the compaction template of FIG. 11 is obtained from the compaction set V {0, 3, 6}, it is needless to say that times 0, 3 and 6 are marked with checks.

Next, a range for the reverse transformation in the test sequence is determined. Since the maximum overlap length of the compaction template is "4", test patterns in times 9 through 12 may be changed through the following basic test sequence transformation. Also, since the primitive template has an effective length of 6, test patterns in times previous to time 9 by 5 (=the effective length−1) cannot be subjected to the reverse transformation. Herein, the effective length of the primitive template is obtained by subtracting, from the length of the primitive template, the number of times having "X" alone as test pattern that continue from the final time of the primitive template. Accordingly, among times 0 through 3, the reverse transformation is conducted with respect to times 1 and 2 that are not provided with a simulation flag.

FIGS. 22(a) and 22(b) are diagrams for explaining the reverse transformation conducted on the test sequences in times 1 and 2. Prior to the reverse transformation, "0" or "1" is randomly substituted for "X" in the test sequences of times 0 through 8. (In FIGS. 22(a) and 22(b), the substituted "0" and "1" are surrounded with squares.) As is shown in FIG. 22(a), test patterns are generated through the reverse transformation of the test sequences of times 1 through 7, the fault simulation is executed by using these new test patterns, and the simulation flag in time 1 is marked with a check. Furthermore, as is shown in FIG. 22(b), test patterns are generated through the reverse transformation of test sequences of times 2 through 8, the fault simulation is executed by using these new test patterns, and the simulation flag in time 2 is marked with a check. A fault that can be detected through the fault simulation using the new test patterns can be removed from the target of the subsequent test sequence generation. Accordingly, test sequences can be largely shortened.

Next, compaction conducted through the reverse transformation of test sequences combined with the compaction using the ternary compaction operation of Embodiment 2 will be described with reference to FIGS. 23(a) and 23(b).

FIG. 23(a) shows test sequences generated by compacting, using the ternary compaction operation, basic test sequences obtained from the three test patterns T1 through T3 of FIG. 13(a). On the basis of the results of the compaction as is shown in FIGS. 17(a) and 17(b), the simulation flags in times 0, 2 and 4 are marked with checks. The reverse transformation is conducted in a range of times prior to time 4, that is, the largest time where the simulation flag is marked with a check. However, even in this range, "X" can be changed to "1" or "0" through the compaction of basic test sequences generated subsequently.

Therefore, in each time belonging to the range for executing the reverse transformation, the proportion of "X" in test patterns generated through the reverse transformation is calculated. With respect to time where the proportion is, for example, smaller than 50%, it is regarded that there is a less chance that "X" is changed into "0" or "1" through the subsequent compaction, and hence, the reverse transformation is conducted. Needless to say, the reverse transformation can be unconditionally conducted. As is shown in FIG. 23(a), the proportion of "X" is 50% (=3/6) in time 1 and 67% (4/6) in time 3, and hence, the proportion is not smaller than 50% in these times. Accordingly, it is regarded that there is a good chance that "X" is changed into "0" or "1" through the subsequent compaction, and therefore, the reverse transformation is not conducted.

FIG. 23(b) shows test sequences generated by compacting basic test sequences obtained from the three test patterns T4 through T6 of FIG. 13(a) with the test sequences of FIG. 23(a). The reverse transformation is conducted in a range of times prior to time 10, that is, the largest time where the simulation flag is marked with a check. The proportion of "XX" in test patterns generated through the reverse transformation is 50% (=3/6) in time 1, 50% (=3/6) in time 5, 33% (=2/6) in time 6, 50% (=3/6) in time 8, and 67% (=4/6) in time 9. Since the proportion of "X" is smaller than 50% in time 6, the reverse transformation is conducted with respect to time 6, "0" or "1" is randomly substituted for "X" in the test patterns, and the fault simulation is executed. A fault that can be detected through the fault simulation using these new test patterns can be removed from the target of the subsequent test sequence generation. Accordingly, test sequences can be largely shortened.

In this manner, according to this embodiment, a new test pattern is generated through the reverse transformation of a test sequence, a fault simulation is executed on the time expansion model by using this new test pattern, and a fault thus detected is removed from the target of the subsequent test sequence generation. Accordingly, the length of test sequences for a sequential circuit can be shortened. This embodiment can be combined with dynamic compaction of test patterns with respect to a time expansion model.

Embodiment 4

In the test sequence transformation in Embodiment 3, a test sequence having a length L that has not been used in the fault simulation is extracted from already generated test sequences, and an undetected fault is detected through the fault simulation conducted on the time expansion model by using a test pattern obtained from the extracted test sequence through the reverse transformation (namely, by using a reverse transformation pattern), thereby dynamically reducing the number of test patterns generated with respect to the time expansion model. In this case, the length L of the test sequence corresponds to the number of labels in the time expansion model.

However, there is a chance that the so-called reverse transformation pattern includes a large number of "don't care" ("X") as compared with a test pattern generated for detecting a given fault (deterministic pattern). In executing the fault simulation on the time expansion model, "X" is randomly set to "0" or "1" in the test pattern, and hence, the randomness of values of respective primary inputs is very high in using the reverse transformation pattern. Therefore, there is a slight chance that an undetected fault can be detected.

A time expansion model is a combinational circuit, and hence, a compaction technique for test patterns for a combinational circuit can be utilized in order to reduce the number of test patterns generated for a time expansion model. Therefore, in Embodiment 4, a reverse transformation pattern and a deterministic pattern are dynamically compacted, so as to increase the number of undetected faults that can be detected through the fault simulation executed on a time expansion model. Thus, the number of test patterns generated with respect to the time expansion model can be reduced.

FIG. 24 is a flowchart for showing procedures in a method of generating test sequences according to this embodiment. In FIG. 24, a time expansion model is generated from an acyclic sequential circuit in step S101, and it is determined in step S102 whether or not test patterns are generated with respect to all undetected faults defined in the time expansion model. When the test patterns are generated with respect to all the undetected faults, the procedure proceeds to step S111, and when not, the procedure proceeds to step S103.

One fault is selected from an undetected fault list as a target of the test pattern generation (target fault) in step S103, a test pattern is generated for the target fault in step S104, and the test pattern is compacted by using a test pattern compaction buffer having a constant buffer length in step S105. It is determined in step S106 whether or not the number of test patterns exceeds the length of the test pattern compaction buffer, namely, whether or not the test patterns overflow the test pattern compaction buffer. When the test patterns overflow, the procedure proceeds to step S107, and when not, the procedure returns to step S102.

A test pattern overflown from the test pattern buffer is taken out in step S107, and fault simulation is executed on the time expansion model in step S108 by using the test pattern taken out in step S107. The test pattern generated with respect to the time expansion model is transformed into a test sequence with respect to the corresponding acyclic sequential circuit in step S109, and it is determined in step S110 whether or not a reverse transformation pattern is extracted from the transformed test sequence. When the reverse transformation pattern is extracted, the procedure returns to step S105, and when not, the procedure returns to step S102.

It is determined whether or not any test pattern is present in the test pattern compaction buffer in step S111, and when present, the procedure proceeds to step S107, and when the test pattern compaction buffer stores no test pattern, the process is completed.

FIG. 25 is a flowchart for showing detailed procedures in the compaction step S105 of FIG. 24, wherein TP indicates a test pattern stored in the test pattern compaction buffer. FIG. 26 is a flowchart for showing detailed procedures in the test sequence transformation step S109 of FIG. 24.

Now, the method of generating test sequences according to this embodiment will be described with reference to FIGS. 27 through 33. In the following description, the acyclic sequential circuit of FIG. 5(a) is used as a target for test sequence generation, and it is assumed that thirty undetected faults f0 through f29 with respect to this acyclic sequential circuit are registered in the undetected fault list. Also, the test pattern compaction buffer is assumed to have a buffer length L of 8. From the circuit of FIG. 5(a), the time expansion model of FIG. 5(b) is generated.

FIG. 27 is a diagram for showing the contents of the test pattern compaction buffer. Herein, it is assumed that test patterns t0 through t7, that is, deterministic patterns generated with respect to the eight faults f0 through f7 among the undetected faults have already been stored in the test pattern compaction buffer (S102 through S106). Also, as is shown in FIG. 27, the test pattern compaction buffer is provided with a reverse transformation flag for indicating whether or not the corresponding test pattern is a reverse transformation pattern, and a pointer for indicating, when the test pattern is a reverse transformation pattern, time of a test sequence from which the reverse transformation pattern is extracted.

Next, the fault f8 is selected as the target fault, and a test pattern in which PI1(0)=1, PI2(0)=X, PI3(0)=0, PI1(1)=0, PI2(4)=1, and PI3(5)=0 (hereinafter expressed as {1X0010}) is generated as a test pattern t8 (S103 and S104). Then, the test pattern t8 is tried t0 be compacted with the respective test patterns to through t7 stored in the test pattern compaction buffer of FIG. 27 in accordance with the compaction operation of FIG. 16 (S105).

It is found that the test pattern t8 is not compatible with any of the test patterns to through t5 but is compatible with the test pattern t6 (S115 through S117 and S123). As a result of the compaction of the test patterns t6 and t8, a test pattern t6•8 {110010} is obtained. Since the test pattern t8 is not a reverse transformation pattern but a deterministic pattern, the test patterns stored in the test pattern compaction buffer are sorted in the descending order of the number of X without conducting steps S120 and S121 (S122). As a result of the sort, the test pattern compaction buffer attains contents as is shown in FIG. 28.

Next, the fault f9 is selected as the target fault, and a test pattern {1XX100} is generated as a test pattern t9 (S103 and S104). The test pattern t9 is tried to be compacted with the respective test patterns stored in the test pattern compaction buffer shown in FIG. 28 (S105).

Since the test pattern t9 is not compatible with any of the test patterns stored in the test pattern compaction buffer (S115 through S117 and S123), the procedure proceeds to step S124. At this point, the number NUMX(TP) of X in the test pattern t9 is 2, and the number NUMX(BUF(L-1)) of X in the test pattern t6•8 stored in the last BUF(7) of the test pattern compaction buffer is 0. Therefore, the test pattern t6•8 is overflown from the test pattern compaction buffer and the test pattern t9 is stored in the BUF(7) instead. Since the test pattern t9 is not a reverse transformation pattern but a deterministic pattern, the test patterns stored in the test pattern compaction buffer are sorted in the descending order of the number of X without conducting steps S120 and S121 (S122). As a result of the sort, the test pattern compaction buffer attains contents as is shown in FIG. 29.

Next, the test pattern t6•8 overflown from the test pattern compaction buffer is taken out, so as to execute the fault simulation on the time expansion model (shown in FIG. 5(b),). It is assumed that the faults f14 through f16 are detected in addition to the faults f6 and f8 in this fault simulation. The thus detected faults f6, f8 and f14 through f16 are removed from the undetected fault list (S107 and S108). At this point, the twenty-five undetected faults f1 through f5, f7, f9 through f13 and f17 through f29 remain in the list.

Then, the test sequence transformation step S109 is executed on the test pattern t6•8. Since the test pattern t6•8 is a deterministic pattern, it is transformed into a test sequence (S132). FIG. 30 is a diagram for showing the test sequences obtained through the transformation of the test pattern t6•8. At this point, since no test sequence for the acyclic sequential circuit has been obtained yet, the test sequences of FIG. 30 obtained from the test pattern t6•8 are the test sequences for the entire acyclic sequential circuit. Then, in order to indicate that the fault simulation has been executed on the test sequences in times 0 through 5, a simulation flag is provided in time 0 (S133). Also, since none of the test sequences of FIG. 30 is reversibly transformable, the reverse transformation is not conducted (S134).

Since no reverse transformation pattern is extracted from the test sequences (NO in step S110), the fault f10 is subsequently selected as the target fault, and a test pattern {X0X000} is generated as a test pattern t10 (S102 through S104). The test pattern t10 is tried to be compacted with the respective test patterns stored in the test pattern compaction buffer of FIG. 29 (S105).

Since the test pattern t10 is not compatible with any of the test patterns stored in the. test pattern compaction buffer (S115 through S117 and S123), the procedure proceeds to step S124. At this point, the number NUMX(TP) of X in the test pattern t10 is 2, and the number NUMX(BUF(L-1)) of X in the test pattern t7 stored in the last BUF(7) of the test pattern compaction buffer is 1. Therefore, the test pattern t7 is overflown from the test pattern compaction buffer and the test pattern t10 is stored instead in the last BUF(7) of the test pattern compaction buffer. Since the test pattern t10 is not a reverse transformation pattern but a deterministic pattern, the test patterns stored in the test pattern compaction buffer are sorted in the descending order of the number of X without conducting steps S120 and S121 (S122). As a result of the sort, the test pattern compaction buffer attains contents as is shown in FIG. 31.

Next, the test pattern t7 overflown from the test pattern compaction buffer is taken out, so as to execute the fault simulation on the time expansion model with "X" randomly set to "0". It is assumed that the fault f17 is detected in addition to the fault f7 in this fault simulation. The thus detected faults f7 and f17 are removed from the undetected fault list (S107 and S108). At this point, the twenty-three undetected faults f1 through f5, f9 through f13 and f18 through f29 remain in the list.

Then, the test sequence transformation step S109 is executed on the test pattern t7. Since the test pattern t7 is a deterministic pattern, it is transformed into a test sequence with respect to the acyclic sequential circuit so as to be synthesized with the test sequences with respect to the entire acyclic sequential circuit shown in FIG. 30 (S132 and S133). FIG. 32 is a diagram for showing the test sequences for the entire acyclic sequential circuit thus obtained. In FIG. 32, the test sequence obtained from the test pattern t7 is compacted with the test sequence of FIG. 30 with the skew value of 2. In order to indicate that the fault simulation has been executed on the test sequences in times 2 through 7, a simulation flag is provided in time 2 (S133).

Next, the test sequences of FIG. 32 are subjected to the reverse transformation step S134. Referring to the simulation flags, the test sequences in times where the fault simulation has not been executed are searched for, so as to conduct the reverse transformation for obtaining test patterns with respect to the time expansion model. FIG. 33 is a diagram for showing a result of the reverse transformation step thus conducted. As is shown in FIG. 33, a test pattern t11 {0XX1X0} is extracted through the reverse transformation from the test sequences in times 1 through 6. Furthermore, in order to indicate that the fault simulation is executed on the test sequences in times 1 through 6, a simulation flag is provided in time 1.

Since the reverse transformation pattern t11 is extracted from the test sequences (YES in step S110), the reverse transformation pattern t11 is tried to be compacted with the respective test patterns stored in the test pattern compaction buffer of FIG. 31 (S105). The reverse transformation pattern t11 is not compatible with any of the test patterns t0 and t1 but is compatible with the test pattern t2 (S115 through S117 and S123). As a result of the compaction of the reverse transformation pattern t11 and the test pattern t2, a test pattern t2•11 {0XX110} is obtained. The test pattern t2•11 is stored in the BUF(2) instead of the test pattern t2.

Since the test pattern t11 is a reverse transformation pattern, a reverse transformation flag is provided in the BUF(2), and a pointer is set to indicate time 1 of the corresponding test sequence (S120 and S121). This pointer indicate that the test pattern t2•11 stored in the BUF(2) is always transformed into the test sequences of times 1 through 6 and that the test sequences of times 1 through 6 are changed in accordance with update of the test pattern t2•11. Also, the reverse transformation flag indicates that the test pattern t2•11 is obtained by compacting a reverse transformation pattern and hence cannot be compacted with another reverse transformation pattern. In accordance with the values of the test pattern t2•11, the value of the primary input PI2 in time 5 in the test sequence is updated to "1". Then, the test patterns stored in the test pattern compaction buffer are sorted in the descending order of the number of X (S122). As a result of the sort, the test pattern compaction buffer attains contents as is shown in FIG. 34. Also, test sequences for the entire acyclic sequential circuit of FIG. 35 are attained.

Next, the fault f12 is selected as the target fault, and a test pattern {X10110} is generated as a test pattern t12 (S103 and S104). The test pattern t12 is tried to be compacted with the respective test patterns stored in the test pattern compaction buffer shown in FIG. 34 (S105). The test pattern t12 is not compatible with any of the test patterns t0 and t1 but is compatible with the test pattern t2•11 (S115 through S117 and S123). As a result of the compaction of the test patterns t12 and t2•11, a test pattern t2•11•12 {010110} is obtained. The test pattern t2•11•12 is stored in the BUF(2) instead of the test pattern t2•11. Also, the values of the primary inputs PI2 and PI3 are updated to "1" and "0", respectively in the test sequence in time 1 indicated by the pointer of the BUF(2).

Since the test pattern t12 is not a reverse transformation pattern but a deterministic pattern, the test patterns stored in the test pattern compaction buffer are sorted in the descending order of the number of X without conducting steps S120 and S121 (S122). As a result of the sort, the test pattern compaction buffer attains contents as is shown in FIG. 36.

Next, the fault f13 is selected as the target fault, and a test pattern {XX1111} is generated as a test pattern t13 (S103 and S104). The test pattern t13 is tried to be compacted with the respective test patterns stored in the test pattern compaction buffer shown in FIG. 36 (S105).

The test pattern t13 is not compatible with any of the test patterns stored in the test pattern compaction buffer (S115 through S117 and S123), and hence, the procedure proceeds to step S124. At this point, the number NUMX(TP) of X in the test pattern t13 is 2 and the number NUMX(BUF(L-1)) of X in the test pattern t2•11•12 stored in the last BUF(7) of the test pattern compaction buffer is 0. Therefore, the test pattern t2•11•12 is overflown from the test pattern compaction buffer and the test pattern t13 is stored in the BUF(7) instead. Since the test pattern t13 is not a reverse transformation pattern but a deterministic pattern, the test patterns stored in the test pattern compaction buffer are sorted in the descending order of the number of X without conducting steps S120 and S121 (S122).

Subsequently, the test pattern t2•11•12 overflown from the test pattern compaction buffer is taken out, so as to execute the fault simulation on the time expansion model. It is assumed that the faults f18 through f20 are detected in addition to the faults f2, f11 and f12 in this fault simulation. These faults f2, f11, f12 and f18 through f20 thus detected are removed from the undetected fault list (S107 and S108). At this point, the seventeen undetected faults f1, f3 through f5, f9, f10, f13 and f21 through f29 remain in the list. Also, since the test pattern t2•11•12 is provided with a reverse transformation flag, the transformation process is not conducted in the test sequence transformation step S109 (YES in step S131).

In this manner, according to this embodiment, a reverse transformation pattern and a deterministic pattern stored in the test pattern compaction buffer are dynamically compacted, so that undetected faults other than that detected by the deterministic pattern can be detected by using a test pattern obtained through the compaction. On the other hand, when the fault simulation is executed with randomly setting X to "0" or "1" in a reverse transformation pattern, the randomness of the test pattern is so high that an undetected fault cannot be detected in many cases. As a result, it is necessary to generate test patterns with respect to a large number of undetected faults. In other words, according to this embodiment, the number of undetected faults as the target of the test pattern generation can be definitely reduced as compared with that in the conventional technique, and hence, the length of test sequences can be further shortened.

Embodiment 5

In Embodiment 1 through 4, respective test sequences generated from test patterns with respect to the time expansion model have a constant length, and the compaction is conducted after transforming the test patterns into the test sequences having the same length. In such a case, there is a chance that test sequences for the entire circuit resulting from the compaction are unnecessarily long.

As a result of executing the fault simulation by using a given test pattern, when the maximum value of labels including a primary output where a fault is detected is smaller than the maximum value of labels of the time expansion model, the value of a primary input included in label larger than the maximum value of the labels including the primary output where the fault is detected is unnecessary as a test sequence. Accordingly, the test sequence can be shortened in such a case.

FIG. 37 is a flowchart for showing procedures in a method of generating test sequences according to Embodiment 5, wherein merely procedures relating to transformation from one test pattern into a test sequence are shown. The procedures shown in FIG. 37 correspond to, for example, the procedures in step S132 (shown in FIG. 26) in the method of generating test sequences of Embodiment 4.

In FIG. 37, it is determined whether or not all primary outputs are checked for fault detection condition in step S141. When all the primary outputs are checked, the procedure proceeds to step S145, and when not, the procedure proceeds to step S142. One primary output not processed yet is selected in 25 step S142, and it is determined in step S143 whether or not a fault is detected in the primary output selected in step S142. When a fault is detected, the procedure proceeds to step S144, so that the primary output can be registered in an essential primary output list, and the procedure returns to step S141. When no fault is detected, the procedure directly returns to step S141.

A maximum value DPOmax of labels including the primary output where a fault is detected is obtained based on the essential primary output list in step S145, and a test pattern is transformed into a test sequence having a length DPOmax+1 in step S146. In step S146, a test pattern with respect to the time expansion model is transformed into a test sequence with respect to an acyclic sequential circuit not using a value of a primary input belonging to labels with values larger than the maximum value DPOmax but referring to primary inputs belonging to labels 0 through DPOmax alone.

FIG. 38 shows an acyclic sequential circuit exemplified as a target of this embodiment. In FIG. 38, PI1 through PI3 indicate primary inputs, PO1 and PO2 indicate primary outputs, C1 through C4 indicate combinational logic units and FF1 through FF3 indicate flipflops. The flipflops FF1 through FF3 receive a common clock, which is not shown in FIG. 38.

FIG. 39 is a diagram of a time expansion model of the acyclic sequential circuit of FIG. 38. In FIG. 39, PI1(0), PI2(0), PI2(1), PI1(2), PI2(2) and PI3(2) indicate primary inputs and PO1(1) and PO2(3) indicate primary outputs, wherein a number in parentheses represents label including the primary input or the primary output. Furthermore, a hatched portion in the combination logic unit C1 indicates a signal line or a gate connected with nothing and is eliminated in the time expansion model.

It is assumed that a test pattern {010110} is given and that the fault simulation is executed on the time expansion model by using this test pattern.

First, the primary output PO1(1) is checked for the fault detection condition (S142 and S143). Since a fault is detected in the primary output PO1(1), this primary output is registered in the essential primary output list (S144). Next, the primary output PO2(3) is checked for the fault detection condition (S142 and S143). Since no fault is detected in the primary output PO2(3), it is not registered in the essential primary output list. As a result, the primary output PO1(l) alone is registered in the essential primary output list (S141).

Next, on the basis of the essential primary output list, the maximum label value DPOmax is obtained (S145). Since the primary output PO1(1) alone is registered in the essential primary output list, the value of label including the primary output PO1(1), namely, 1, is the maximum label value DPOmax. Then, the test pattern is transformed into a test sequence by using merely the values of the primary inputs PI1(0), PI2(0) and PI2(1) belonging to labels 0 through 1 (=DPOmax) (S146). As a result, a test sequence with a length of 2 (=DPOmax+1) as is shown in FIG. 40 is obtained.

At this point, it is assumed that test sequences as is shown in FIG. 41 have already been generated as test sequences for the entire circuit. The test sequences having a length of 2 of FIG. 40 are compatible with respect to time 1 of the test sequences of FIG. 41, and the length of the test sequences remains the same (as 9) as a result of the compaction. On the other hand, when the test pattern {0101101} is transformed into a test sequence without considering the fault detection condition of each primary output, the resultant test sequences have a length of 3. Furthermore, these test sequences cannot be compacted with the test sequences of FIG. 41, and hence need to be connected with them from time 9. As a result, the obtained test sequences have a length of 12.

In this manner, according to this embodiment, the fault detection condition of each primary output is checked in transforming a test pattern with respect to a time expansion model into a test sequence with respect to an acyclic sequential circuit. Accordingly, test sequences resulting from the compaction can be shortened to a length corresponding to the maximum label value including a primary output where a fault is detected+1. As a result, the compaction efficiency of test sequences can be improved and the test sequences can be shortened.

Embodiment 6

In Embodiments 1 through 4, respective test sequences generated from test patterns with respect to a time expansion model have a constant length, and the compaction is conducted after transforming the test patterns into the test sequences having the same length. In this case, there is a chance that test sequences for the entire circuit resulting from the compaction are unnecessarily long.

As a result of executing the fault simulation by using a given test pattern, values of primary inputs excluding a primary input reachable from a primary output where a fault is detected are unnecessary for the test sequences because these primary inputs are not involved in the fault detection. Accordingly, the number of X included in test sequences can be increased by setting the values of the primary inputs not relating to the fault detection to X. As a result, the compaction efficiency of test sequences can be improved.

FIG. 42 is a flowchart for showing procedures in a method of generating test sequences according to Embodiment 6, wherein merely procedures relating to transformation of one test pattern into a test sequence are shown. The procedures of FIG. 42 correspond to, for example, the procedures in step S132 (shown in FIG. 26) in the method of generating test sequences of Embodiment 4.

In FIG. 42, it is determined whether or not all primary outputs are checked for fault detection condition in step S151. When all the primary outputs are checked, the procedure proceeds to step S155, and when not, the procedure proceeds to step S152. One primary output not processed yet is selected in step S152, and it is determined in step S153 whether or not a fault is detected in the primary output selected in step S152. When a fault is detected, the procedure proceeds to step S154, so as to register a primary input reachable from that primary output in an essential primary input list, and the procedure returns to step S151. When no fault is detected, the procedure directly returns to step S151.

Values of primary inputs excluding those registered in the essential primary input list are substituted for X in step S155, and a test pattern is transformed into a test sequence in step S156.

FIG. 43 is a diagram of an acyclic sequential circuit exemplified as a target in this embodiment. In FIG. 43, PI1 through PI8 indicate primary inputs, PO1 through PO3 indicate primary outputs, C1 through C11 indicate combinational logic units, and FF1 through FF3 indicate flipflops. The flipflops FF1 through FF3 receive a common clock, which is not shown in FIG. 43.

FIG. 44 is a diagram of a time expansion model of the acyclic sequential circuit of FIG. 43. In FIG. 44, PI2(0), PI3(0), PI4(0), PI4(1), PI5(2), PI6(2), PI7(2), PI1(3), PI2(3), PI3(3), and PI8(3) indicate primary inputs, PO1(1), PO2(2) and PO3(3) indicate primary outputs, wherein a number in parentheses represents label including the primary input or the primary output.

FIG. 45 is an undirected graph representing the relationship in reach between the primary inputs and the primary outputs in the time expansion model of FIG. 44. In FIG. 45, each node represents a primary input or a primary output, and an edge indicates that a primary input and a primary output corresponding to the nodes at its ends are reachable.

It is assumed that a test pattern {01101110010} is given and that fault simulation is executed on the time expansion model by using this test pattern.

First, the primary output PO1(1) is checked for the fault detection condition (S152 and S153). No fault is detected in the primary output PO1(1). Next, the primary output PO2(2) is checked for the fault detection condition (S152 and S153). Since a fault is detected in the primary output PO2(2), the primary inputs PI6(2) and PI7(2) that can reach the primary output PO2(2) are registered in the essential primary input list (S154). Next, the primary output PO3(3) is checked for the fault detection condition (S152 and S153). No fault is detected in the primary output PO3(3). As a result, the primary inputs PI6(2) and PI7(2) alone are registered in the essential primary input list (S151).

Subsequently, the values of the primary inputs excluding those registered in the essential primary input list, namely, the values of the primary inputs PI2(0), PI3(0), PI4(0), PI4(1), PI5(2), PI1(3), PI2(3), PI3(3) and PI8(3), are set to X (S155). Then, the resultant test pattern {XXXXX11XXXX} is transformed into a test sequence with respect to the acyclic sequential circuit (S155). As a result, test sequences as is shown in FIG. 46 are obtained.

It is assumed that test sequences as is shown in FIG. 47 have already been generated for the entire circuit. Since the test sequences of FIG. 46 can be compacted with the respect to time 1 of the test sequences of FIG. 47, the length of the test sequences remains the same (as 6) through the compaction. On the other hand, when the test pattern {01101110010} is transformed into a test sequence without considering the fault detection condition of the primary outputs, the resultant sequences can be compacted merely with respect to time 4 of the test sequences of FIG. 47. Therefore, the resultant length is 8.

In this manner, according to this embodiment, in transforming a test pattern with respect to a time expansion model into a test sequence with respect to an acyclic sequential circuit, the fault detection condition of respective primary outputs are checked so as to specify primary inputs that can reach a primary output where a fault is detected. As a result, the test sequence resulting from the transformation includes a large number of X. Accordingly, the compaction efficiency of test sequences can be improved and the length of the test sequences can be shortened.

As described so far, according to the present invention, test patterns generated with respect to a time expansion model are transformed into test sequences with compaction accompanied, and hence, the length of test sequences with respect to a sequential circuit can be decreased. This compaction can be conducted by using a compaction template or a ternary compaction operation. Also, a test sequence once generated is reversely transformed into a new test pattern, so as to remove a fault that can be detected by using this new test pattern from a target of subsequent test sequence generation. Thus, the length of test sequences can be further decreased.

What is claimed is:

1. A method of generating test sequences for use in fault testing for an integrated circuit comprising the steps of:

generating a time expansion model including a combinational circuit by subjecting said integrated circuit to timeframe expansion;

generating a compaction template by compacting one or more primitive templates indicating whether or not a primary input or a pseudo primary input is present in each label of said time expansion model; and transforming test patterns generated with respect to said time expansion model into test sequences with respect to said integrated circuit by substituting each of said test patterns in said compaction template and connecting resultant compaction templates.

2. The method of generating test sequences of claim 1, wherein said step of generating a compaction template includes:

a first step of generating a primitive template from said time expansion model;

a second step of trying whether or not two primitive templates are compatible with respective skew values;

a third step of generating, on the basis of a result obtained through trials of said second step, a compatibility graph in which nodes indicate said primitive template, each of said nodes having a label, and an edge indicating compatibility of said primitive template by using, as a skew value, a difference between values of labels of nodes at ends thereof, and obtaining a compaction set including, as elements, labels of nodes belonging to a maximum clique extracted from said compatibility graph; and a fourth step of generating said compaction template by overlapping primitive templates in number corresponding to the number of said elements of said compaction set by using differences in values of labels between one element and other elements as skew values.

3. The method of generating test sequences of claim 2, wherein said third step includes a step of giving a weight to each edge of said compatibility graph and extracting said maximum clique on the basis of said weight.

4. The method of generating test sequences of claim 1, wherein said step of generating a compaction template includes a substep of obtaining a maximum overlap length corresponding to a maximum value of lengths where said resultant compaction templates are capable of overlapping each other in connecting said resultant compaction templates, and said step of transforming test patterns includes a step of transforming said resultant compaction templates by overlapping by said maximum overlap length.

5. A method of generating test sequences for use in fault testing for an integrated circuit comprising the steps of:

generating a time expansion model including a combinational circuit by subjecting said integrated circuit to timeframe expansion;

transforming test patterns generated with respect to said time expansion model into test sequences with respect to said integrated circuit, wherein said step of transforming test patterns includes substeps of:

subjecting an already generated test sequence to reverse transformation in process of test sequence transformation;

executing fault simulation for said time expansion model by using a new test pattern obtained through said reverse transformation; and removing a fault detected in said fault simulation from a target of subsequent test sequence generation.

6. A method of generating test sequences for use in fault testing for an integrated circuit comprising the steps of:

generating a time expansion model including a combinational circuit by subjecting said integrated circuit to timeframe expansion;

transforming test patterns generated with respect to said time expansion model into test sequences with respect to said integrated circuit, wherein said step of transforming test patterns includes substeps of:

storing a generated test pattern in a test pattern compaction buffer, with compaction accompanied;

when a test pattern is overflown from said test pattern compaction buffer, executing fault simulation for said time expansion model by using said overflown test pattern, so as to remove a fault detected in said fault simulation from a target of subsequent test sequence generation;

transforming said overflown test pattern into a test sequence and compacting said resultant test sequence with an already generated test sequence; and subjecting said compacted test sequence to reverse transformation so as to store a new test pattern obtained through said reverse transformation in said test pattern compaction buffer, with compaction accompanied.

7. A method of generating test sequences for use in fault testing for an integrated circuit comprising the steps of:

generating a time expansion model including a combinational circuit by subjecting said integrated circuit to timeframe expansion;

transforming test patterns generated with respect to said time expansion model into test sequences with respect to said integrated circuit, wherein said step of transforming test patterns includes when transforming one test pattern into a test sequence, substeps of:

executing fault simulation for said time expansion model by using said test pattern;

obtaining a maximum value of labels including a primary output where a fault is detecting in said fault simulation; and transforming said test pattern into a test sequence without using a value of a primary input belonging to a label with a value larger than said maximum value.

8. A method of generating test sequences for use in fault testing for an integrated circuit comprising the steps of:

generating a time expansion model including a combinational circuit by subjecting said integrated circuit to timeframe expansion;

transforming test patterns generated with respect to said time expansion model into test sequences with respect to said integrated circuit, wherein said step of transforming test patterns includes when transforming one test pattern into a test sequence, substeps of:

executing fault simulation for said time expansion model by using said test pattern;

specifying a primary output reachable from a primary output where a fault is detected in said fault simulation; and transforming said test pattern into a test sequence with a value of a primary input excluding said specified primary input set to "don't care."

* * * * *